United States Patent
Park et al.

(10) Patent No.: US 11,626,389 B2
(45) Date of Patent: Apr. 11, 2023

(54) DISPLAY DEVICE

(71) Applicant: Samsung Display Co., Ltd., Yongin-si (KR)

(72) Inventors: Jun Hong Park, Yongin-si (KR); Tae Gyun Kim, Yongin-si (KR); Jun Chun, Yongin-si (KR); Eui Suk Jung, Yongin-si (KR); Hyun Young Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/087,458

(22) Filed: Nov. 2, 2020

(65) Prior Publication Data

US 2021/0202796 A1 Jul. 1, 2021

(30) Foreign Application Priority Data

Dec. 27, 2019 (KR) .................. 10-2019-0176868

(51) Int. Cl.
*H01L 25/075* (2006.01)
*H01L 33/62* (2010.01)
*H01L 27/12* (2006.01)

(52) U.S. Cl.
CPC ........ *H01L 25/0753* (2013.01); *H01L 27/124* (2013.01); *H01L 33/62* (2013.01)

(58) Field of Classification Search
CPC ..... H01L 25/0753; H01L 27/124–1244; H01L 27/15–156; H01L 33/62; H01L 2933/0066
See application file for complete search history.

(56) References Cited

U.S. PATENT DOCUMENTS

| | | | |
|---|---|---|---|
| 10,249,603 B2 | 4/2019 | Cho et al. | |
| 10,497,680 B2 | 12/2019 | Sung et al. | |
| 2012/0193661 A1* | 8/2012 | Emerson | H01L 33/52 257/98 |
| 2014/0140079 A1* | 5/2014 | Marutani | H01L 25/0753 362/418 |

(Continued)

FOREIGN PATENT DOCUMENTS

| KR | 10-1782889 B1 | 9/2017 |
|---|---|---|
| KR | 10-2018-0077114 A | 7/2018 |

(Continued)

*Primary Examiner* — Yu Chen
(74) *Attorney, Agent, or Firm* — Lewis Roca Rothgerber Christie LLP

(57) ABSTRACT

A display device includes a display element layer on a substrate. The display element layer may include first and second electrodes, and light emitting elements electrically coupled to the first and second electrodes. The first electrode may include first protrusions, a first portion located between the first protrusions, a second portion corresponding to a side of each first protrusion, and a third portion coupled between the first portion and a first end of the second portion. The second electrode may include second protrusions that protrude toward the first electrode and are spaced apart from each other in the first direction, a first portion located between the second protrusions, a second portion corresponding to a side of each of the second protrusions, and a third portion coupled between the first portion and a first end of the second portion.

18 Claims, 14 Drawing Sheets

(56) References Cited

U.S. PATENT DOCUMENTS

| | | | |
|---|---|---|---|
| 2015/0084073 A1* | 3/2015 | Yamada | H01L 33/56 |
| | | | 257/98 |
| 2018/0019369 A1* | 1/2018 | Cho | H05K 1/11 |
| 2018/0175009 A1* | 6/2018 | Kim | H01L 27/156 |
| 2019/0081261 A1 | 3/2019 | Lee et al. | |
| 2019/0179458 A1* | 6/2019 | Weber | G06F 3/041 |
| 2021/0358393 A1* | 11/2021 | Kang | H01L 33/62 |
| 2022/0005979 A1* | 1/2022 | Kang | H01L 25/0753 |

FOREIGN PATENT DOCUMENTS

| | | |
|---|---|---|
| KR | 10-2019-0029831 A | 3/2019 |
| KR | 10-1987196 B1 | 6/2019 |
| WO | WO-2021045413 A1 * | 3/2021 |

\* cited by examiner

DISPLAY DEVICE

CROSS-REFERENCE TO RELATED APPLICATION

This application claims priority to and the benefit of Korean patent application No. 10-2019-0176868 filed in the Korean Intellectual Property Office on Dec. 27, 2019, the entire content of which is incorporated herein by reference.

BACKGROUND

1. Field

Various embodiments of the present disclosure relate to a display device.

2. Description of Related Art

A light emitting diode (hereinafter, referred to as an "LED") may have relatively suitable or satisfactory durability even under poor environmental conditions, and have excellent performance in terms of lifetime and luminance. Recently, research on the technology of applying such LEDs to various display devices has become noticeably more active.

As a part of such research, technologies of fabricating a rod-type LED having a small size corresponding to the micro-scale or the nano-scale using an inorganic crystalline structure, e.g., a structure obtained by growing a nitride-based semiconductor are being developed. For example, rod-type LEDs may be fabricated in a size small enough to form a pixel of a self-emissive display device, etc.

SUMMARY

Various embodiments of the present disclosure are directed to a display device having light emitting elements having excellent alignment.

An embodiment of the present disclosure may provide a display device, including a display element layer provided on a substrate. The display element layer may include first and second electrodes that extend in a first direction and are spaced apart from each other in a second direction that is different from the first direction; and light emitting elements electrically coupled to the first and second electrodes. The first electrode may include first protrusions that protrude in a plane toward the second electrode and are spaced apart from each other in the first direction; a first portion located between the first protrusions; a second portion corresponding to a side of each of the first protrusions; and a third portion coupled between the first portion and a first end of the second portion. The second electrode may include second protrusions that protrude in the same plane toward the first electrode and are spaced apart from each other in the first direction; a first portion located between the second protrusions; a second portion corresponding to a side of each of the second protrusions; and a third portion coupled between the first portion and a first end of the second portion. The third portion of each of the first and second electrodes may be provided in the same plane and have a curved shape.

In an embodiment, the third portion of the first electrode may be curved in the same plane concavely in a direction away from a direction toward a corresponding first protrusion selected from among the first protrusions, and the third portion of the second electrode may be curved in the plane concavely in a direction away from a direction toward a corresponding second protrusion selected from among the second protrusions.

In an embodiment, the first and second protrusions may be alternately arranged along the first direction.

In an embodiment, at least a portion of the second portion of the first electrode and at least a portion of the second portion of the second electrode may face each other in the first direction.

In an embodiment, the first electrode may further include a fourth portion extending from a second end of the second portion of the first electrode, and the second electrode may further include a fourth portion extending from a second end of the second portion of the second electrode.

In an embodiment, the fourth portion of the first electrode may face the first portion of the second electrode, and the fourth portion of the second electrode may face the first portion of the first electrode.

In an embodiment, a distance from a second end of the second portion of the first electrode to the third portion of the second electrode may be constant (e.g., substantially constant), and a distance from a second end of the second portion of the second electrode to the third portion of the first electrode may be constant (e.g., substantially constant).

In an embodiment, the light emitting elements may include a first light emitting element provided between the first portion of the first electrode and the fourth portion of the second electrode or between the first portion of the second electrode and the fourth portion of the first electrode.

In an embodiment, the light emitting elements may include a second light emitting element provided between the second end of the second portion of the first electrode and the third portion of the second electrode or between the second end of the second portion of the second electrode and the third portion of the first electrode.

In an embodiment, the second light emitting element may be arranged diagonally with respect to the first and second directions.

In an embodiment, the light emitting elements may include a third light emitting element provided between the second portion of the first electrode and the second portion of the second electrode.

In an embodiment, the display element layer may further include a first contact electrode electrically coupling the first electrode to the light emitting elements; and a second contact electrode electrically coupling the second electrode to the light emitting elements.

In an embodiment, the first contact electrode may overlap the first electrode, and have a planar shape that is similar to but is larger than a planar shape of the first electrode, and the second contact electrode may overlap the second electrode, and have a planar shape that is similar to but is larger than a planar shape of the second electrode.

In an embodiment, the third portion of the first electrode may be curved in the same plane to be convex toward the second end of the second portion of the second electrode, and the third portion of the second electrode may be curved in the same plane to be convex toward the second end of the second portion of the first electrode.

In an embodiment, the first portion of the first electrode may be curved in the same plane concavely in a direction away from a direction toward a corresponding first protrusion selected from among the first protrusions, and the first portion of the second electrode may be curved in the same plane concavely in a direction away from a direction toward a corresponding first protrusion selected from among the second protrusions.

In an embodiment, the first portion and the third portion in each of the first and second electrodes may have the same (e.g., substantially the same) radius of curvature.

In an embodiment, the first electrode may further include a fourth portion extending from the second end of the second portion of the first electrode, and the second electrode may further include a fourth portion extending from the second end of the second portion of the second electrode.

In an embodiment, the fourth portion of the first electrode may be curved in the same plane to be convex toward the third portion of the second electrode, and the fourth portion of the second electrode may be curved in the same plane to be convex toward the third portion of the first electrode.

In an embodiment, a distance between the first and second electrodes that are adjacent to each other in the plane may be constant (e.g., substantially constant).

In an embodiment, the fourth portion of each of the first and second electrodes may have a polygonal shape.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1A:
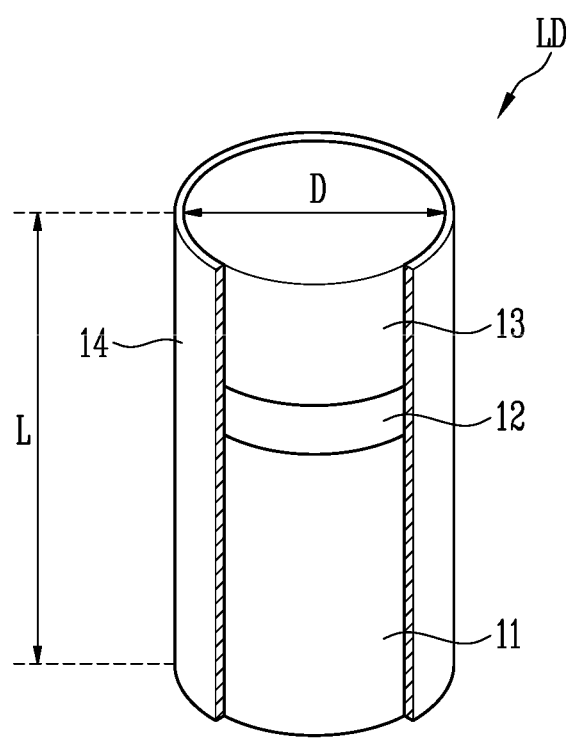
FIGS. 1A and 1B are each a perspective view illustrating a light emitting element in accordance with an embodiment of the present disclosure.

As the present disclosure allows for various changes and numerous embodiments, certain embodiments will be illustrated in the drawings and described in more detail in the written description herein below. However, this is not intended to limit the present disclosure to particular modes of practice, and it is to be appreciated that all changes, equivalents, and substitutes that do not depart from the spirit and technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise," "include," "have," etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be not only directly under the second part but a third part may intervene between them.

Embodiments of the present disclosure will hereinafter be described in more detail with reference to the accompanying drawings.

Figure 1B:
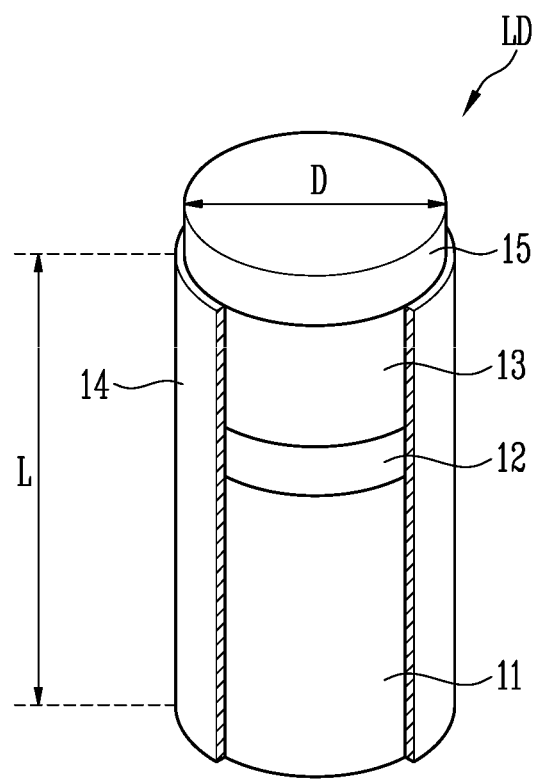

FIGS. 1A and 1B are each a perspective view illustrating a light emitting element in accordance with an embodiment of the present disclosure. Although FIGS. 1A and 1B illustrate a cylindrical light emitting element LD, the present disclosure is not limited thereto.

Referring to FIGS. 1A and 1B, the light emitting element LD in accordance with an embodiment of the present disclosure may include a first semiconductor layer 11, a second semiconductor layer 13, and an active layer 12 interposed between the first semiconductor layer 11 and the second semiconductor layer 13.

For example, the light emitting element LD may be implemented as a stack formed by successively stacking the first semiconductor layer 11, the active layer 12, and the second semiconductor layer 13.

In an embodiment of the present disclosure, the light emitting element LD may be provided in the form of a rod extending in one direction. If the direction in which the light emitting element LD extends is defined as the longitudinal direction, the light emitting element LD may have a first end and a second end in the longitudinal direction (e.g., a first end and a second end spaced apart from each other in the longitudinal direction).

In an embodiment of the present disclosure, one of the first and second semiconductor layers 11 and 13 may be on a first end (e.g. a first portion), and the other of the first and second semiconductor layers 11 and 13 may be on a second end (e.g. a second portion).

The light emitting element LD may have various suitable shapes. For example, the light emitting element LD may have a rod-like shape or a bar-like shape extending in the longitudinal direction (e.g., to have an aspect ratio greater than 1). In an embodiment of the present disclosure, a length L of the light emitting element LD with respect to the longitudinal direction may be greater than a diameter (D, or a width of a cross-section) thereof. The light emitting element LD may include a light emitting diode fabricated to have a small size, e.g., with a length L and/or a diameter D corresponding to a micro scale or a nano scale. For example, the light emitting element LD may have a length L and/or a diameter D of 1 nanometer (nm) to 5 micrometers (μm), such as, for example, 1 nm to 100 nm, 100 nm to 5 μm, or 100 nm to 800 nm. In various embodiments of the present disclosure, the shape of the light emitting element LD may be changed so as to meet features (or design conditions) of a lighting device or a self-emissive display device.

The first semiconductor layer 11 may include, for example, at least one n-type semiconductor layer. For instance, the first semiconductor layer 11 may include a semiconductor layer which includes any one semiconductor material selected from InAlGaN, GaN, AlGaN, InGaN, AlN, and InN, and is doped with a first conductive dopant such as Si, Ge, or Sn.

The material included in the first semiconductor layer 11 is not limited thereto, and the first semiconductor layer 11 may include various other suitable materials.

The active layer 12 may be formed on the first semiconductor layer 11 and have a single or multiple quantum well structure. In various embodiments of the present disclosure, a cladding layer doped with a conductive dopant may be on and/or under the active layer 12. For example, the cladding layer may include an AlGaN layer and/or an InAlGaN layer. In addition, material such as AlGaN and/or AlInGaN may be employed to form the active layer 12.

If an electric field of a set or predetermined voltage or more is applied to the opposite ends of the light emitting element LD, the light emitting element LD emits light as a result of coupling (e.g., combination) of electron-hole pairs in the active layer 12.

The second semiconductor layer 13 may be provided on the active layer 12 and include a semiconductor layer of a type different (e.g., n-type or p-type) from that of the first semiconductor layer 11. For example, the second semiconductor layer 13 may include at least one p-type semiconductor layer. For instance, the second semiconductor layer 13 may include a semiconductor layer which includes any one semiconductor material selected from InAlGaN, GaN, AlGaN, InGaN, AlN, and InN, and is doped with a second conductive dopant such as Mg.

The material included in the second semiconductor layer 13 is not limited thereto, and the second semiconductor layer 13 may include various other suitable materials.

In an embodiment of the present disclosure, the light emitting element LD may not only include the first semiconductor layer 11, the active layer 12, and the second semiconductor layer 13, but may also include a fluorescent layer, another active layer, another semiconductor layer, and/or an electrode provided on and/or under each layer.

In an embodiment, the light emitting element LD may further include at least one electrode on one end (e.g., an upper surface) of the second semiconductor layer 13 or one end (e.g., a lower surface) of the first semiconductor layer 11.

For example, as illustrated in FIG. 1B, the light emitting element LD may further include an electrode 15 on one end of the second semiconductor layer 13. The electrode 15 may be an ohmic contact electrode, but it is not limited thereto. According to an embodiment, the electrode 15 may be a Schottky contact electrode (e.g., an electrode formed by a junction of a semiconductor and a metal). Furthermore, the electrode 15 may include metal and/or a metal oxide. For example, chrome (Cr), titanium (Ti), aluminum (Al), gold (Au), nickel (Ni), ITO, and an oxide or alloy thereof may be used alone or in combination with each other. However, the present disclosure is not limited to this. In an embodiment, the electrode 15 may be substantially transparent or translucent. Thereby, light generated from the light emitting element LD may be emitted to the outside of the light emitting element LD after passing through the electrode 15.

The light emitting element LD may further include an insulating layer 14. However, in an embodiment of the present disclosure, the insulating layer 14 may be omitted, and/or may be provided to cover only some of the first semiconductor layer 11, the active layer 12, and the second semiconductor layer 13.

For example, the insulating layer 14 may be provided on a portion of the light emitting element LD, other than the opposite ends thereof, such that the opposite ends of the light emitting element LD may be exposed.

For the sake of explanation, FIGS. 1A and 1B illustrate the insulating layer 14 with a portion thereof having been removed. The entirety of the side surface of the light emitting element LD may be enclosed by the insulating layer 14.

The insulating layer 14 may be provided to enclose at least a portion of a periphery (e.g., an outer circumferential surface) of the first semiconductor layer 11, the active layer 12, and/or the second semiconductor layer 13. For example, the insulating layer 14 may be provided to enclose at least the periphery (e.g., the outer circumferential surface) of the active layer 12. In the case where the light emitting element LD includes the electrode 15, the insulating film 14 may enclose at least a portion of the periphery (e.g., the outer circumferential surface) of the electrode 15.

In an embodiment of the present disclosure, the insulating film 14 may include a transparent insulating material. For example, the insulating film 14 may include at least one insulating material selected from the group consisting of $SiO_2$, $Si_3N_4$, $Al_2O_3$, and $TiO_2$, but it is not limited thereto. In other words, various suitable materials having insulating properties may be employed.

If the insulating layer 14 is provided on the light emitting element LD, the active layer 12 may be prevented from short-circuiting with a first and/or second electrode (or a likelihood or degree of such a short circuit may be reduced).

Furthermore, due to the insulating layer 14, occurrence of a defect on the surface of the light emitting element LD may be minimized or reduced, whereby the lifetime and efficiency of the light emitting element LD may be improved. In the case where a plurality of light emitting elements LD are in close contact (e.g., direct or physical contact) with each other, the insulating layer 14 may prevent or reduce occurrence of an undesired short-circuit between the light emitting elements LD.

The light emitting element LD may be employed as a light source for various suitable display devices. For example, the light emitting element LD may be used as a light source element for a lighting apparatus or a self-emissive display device.

Figure 2A:
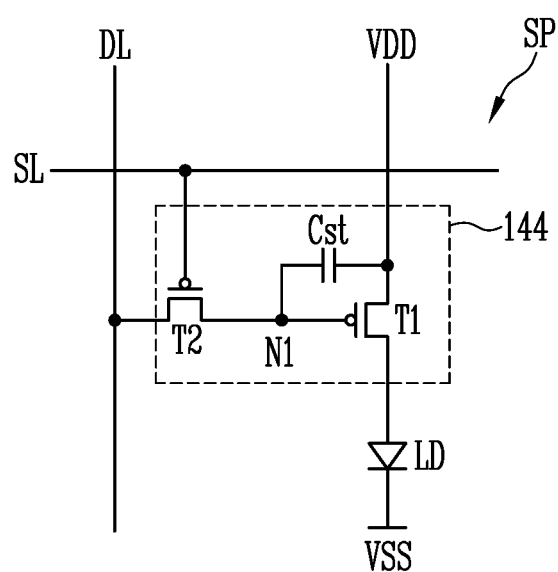
FIGS. 2A and 2B are each a circuit diagram illustrating a unit emission area of a display device in accordance with an embodiment of the present disclosure.
Figure 2B:
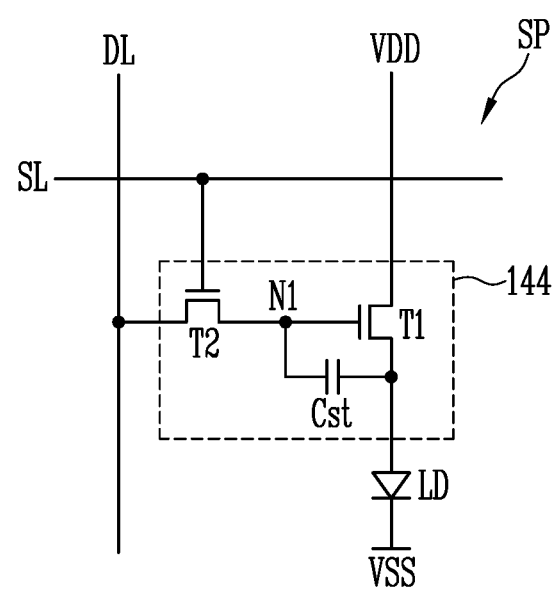

FIGS. 2A and 2B are each a circuit diagram illustrating a unit emission area of a display device in accordance with an embodiment of the present disclosure.

FIGS. 2A and 2B illustrate examples of a pixel that forms an active emission display panel. In an embodiment of the present disclosure, the unit emission area may be a pixel area in which a single sub-pixel is provided.

Referring to FIG. 2A, a sub-pixel SP may include at least one light emitting element LD, and a pixel driving circuit 144 which is coupled to the light emitting element LD to drive the light emitting element LD.

The light emitting element LD may include a first electrode (e.g., an anode electrode) coupled to a first driving power supply VDD via the pixel driving circuit 144, and a second electrode (e.g., a cathode electrode) coupled to a second driving power supply VSS.

The first driving power supply VDD and the second driving power supply VSS may have different potentials (e.g., different electric potentials). For example, the second driving power supply VSS may have a potential lower than that of the first driving power supply VDD by a value equal to or greater than a threshold voltage of the light emitting element LD.

Each of the light emitting elements LD may emit light at a luminance corresponding to driving current which is controlled by the pixel driving circuit 144.

Although FIG. 2A illustrates an embodiment in which each of the sub-pixels SP includes only one light emitting element LD, the present disclosure is not limited thereto. For example, the sub-pixel SP may include a plurality of light emitting elements LD coupled in parallel to each other.

In an embodiment of the present disclosure, the pixel driving circuit 144 may include a first transistor T1, a second transistor T2, and a storage capacitor Cst. However, the structure of the pixel driving circuit 144 is not limited to the embodiment illustrated in FIG. 2A.

The first electrode of the first transistor T1 (driving transistor) is coupled to the first driving power supply VDD, and the second electrode is electrically coupled to the first electrode of each of the light emitting elements LD. A gate electrode of the first transistor T1 is coupled to a first node N1. As such, the first transistor T1 may control the amount of driving current to be supplied to the light emitting elements LD in response to the voltage of the first node N1.

A first electrode of the second transistor (switching transistor; T2) is coupled to a data line DL, and a second electrode thereof is coupled to the first node N1. Here, the first electrode and the second electrode of the second transistor T2 may be different electrodes. For example, if the first electrode is a source electrode, the second electrode may be a drain electrode. A gate electrode of the second transistor T2 is coupled to a scan line SL.

When a scan signal having a voltage (e.g., a low-level voltage) capable of turning on the second transistor T2 is supplied from the scan line SL, the second transistor T2 is turned on to electrically couple the data line DL with the first node N1. Here, a data signal of a corresponding frame is supplied to the data line DL, so that the data signal is transmitted to the first node N1. The data signal transmitted to the first node N1 is charged in the storage capacitor Cst.

One electrode of the storage capacitor Cst is coupled to the first driving power supply VDD, and the other electrode thereof is coupled to the first node N1. The storage capacitor Cst may charge a voltage corresponding to the data signal supplied to the first node N1, and maintain the charged voltage until a data signal of a subsequent frame is supplied.

For the sake of explanation, FIG. 2A illustrates the pixel driving circuit 144 having a relatively simple structure including the second transistor T2 configured to transmit the data signal to the sub-pixel SP, the storage capacitor Cst configured to store the data signal, and the first transistor T1 configured to supply driving current corresponding to the data signal to the light emitting element LD.

However, the present disclosure is not limited thereto, and the structure of the pixel driving circuit 144 may be changed in various suitable ways and may be substantially more complex. For example, the pixel driving circuit 144 may further include at least one transistor element such as a transistor element configured to compensate for the threshold voltage of the first transistor T1, a transistor element configured to initialize the first node N1, and/or a transistor element configured to control an emission time of the light emitting elements LD, or other circuit elements such as a boosting capacitor for boosting the voltage of the first node N1.

Furthermore, although in FIG. 2A the transistors, e.g., the first and second transistors T1 and T2, included in the pixel driving circuit 144 have been illustrated as being formed of p-type transistors, the present disclosure is not limited to this. For example, at least one of the first and second transistors T1 and T2 included in the pixel driving circuit 144 may be changed to an n-type transistor.

Referring to FIG. 2B, in an embodiment of the present disclosure, the first and second transistors T1 and T2 may be implemented as n-type transistors. The configuration and operation of the pixel driving circuit 144 illustrated in FIG. 2B are similar to those of the pixel driving circuit 144 of FIG. 2A, except for a change in connection positions of some components due to a change in the type of transistor, and therefore, duplicative descriptions thereof will not be repeated here.

Figure 3:
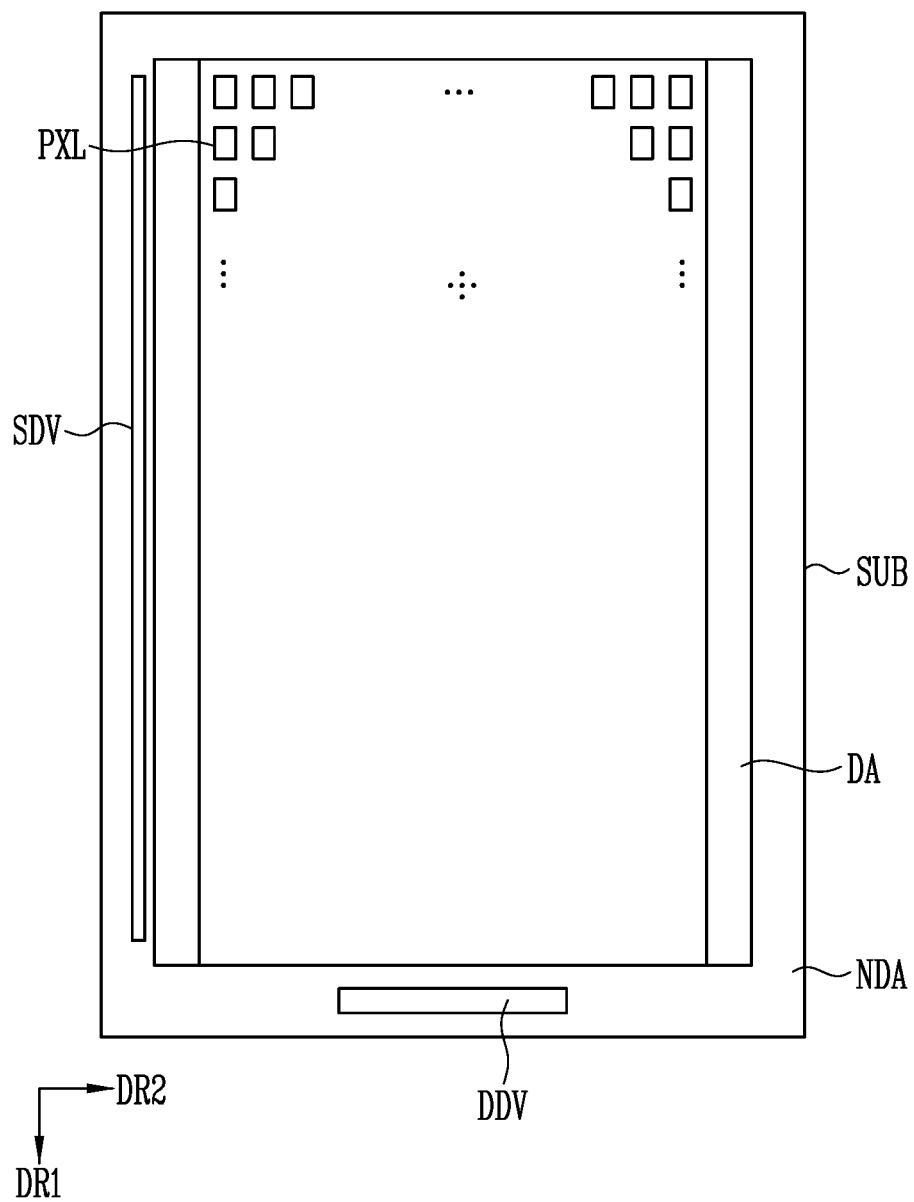
FIG. 3 is a plan view illustrating a display device in accordance with an embodiment of the present disclosure.

FIG. 3 is a plan view illustrating a display device in accordance with an embodiment of the present disclosure. For example, FIG. 3 is a schematic plan view illustrating the display device that uses the light emitting element LD illustrated in FIG. 1A or 1B as a light source.

Referring to FIGS. 1A, 1B, and 3, the display device in accordance with an embodiment of the present disclosure may include a substrate SUB, pixels PXL which are provided on a surface of the substrate SUB, a driver which is provided on the substrate SUB to drive the pixels PXL, and a line component which couples the pixels PXL with the driver.

The display device may be a passive-matrix type display device or an active-matrix type display device according to a method of driving the light emitting element LD. For example, in the case where the display device is implemented as the active-matrix type, each of the pixels PXL may include a driving transistor to control the amount of current to be supplied to the light emitting element LD, and a switching transistor to transmit data signals to the driving transistor.

Recently, active-matrix type display devices capable of selectively turning on each pixel PXL taking into account the resolution, the contrast, and the working speed have been developed or mainstreamed. However, the present disclosure is not limited thereto. For example, passive-matrix type display devices in which pixels PXL may be turned on by groups may also employ components (e.g., first and second electrodes) for driving the light emitting element LD.

The substrate SUB may include a display area DA and a non-display area NDA. The display area DA is an area in which pixels PXL are provided to display an image, and may be referred to as an active area. In various embodiments, each of the pixels PXL may include at least one light emitting element LD. The light emitting element LD may be an organic light emitting diode or a small-sized inorganic light emitting diode having a micro- or nano-scale size, but the present disclosure is not limited thereto. The display device may drive pixels PXL in response to image data input from an external device, thereby displaying an image on the display area DA.

The non-display area NDA is an area which is located around the display area DA, and may be referred to as a non-active area. In various embodiments, the non-display area NDA may comprehensively encompass areas other than the display area DA on the substrate SUB. As illustrated in FIG. 3, the non-display area NDA may enclose the display area DA.

The non-display area NDA may be an area in which the driver for driving the pixels PXL and a portion of the line component for coupling the pixels PXL to the driver are provided.

The pixels PXL may be provided in the display area DA on the substrate SUB. Each of the pixels PXL refers to a unit that can display an image, and a plurality of pixels may be provided. Each of the pixels PXL may include a light emitting element LD which emits white light and/or color light. Each pixel PXL may emit light having any one color selected from among red, green, and blue, but it is not limited thereto. For example, each of the pixels PXL may emit light having any one color selected from among cyan, magenta, yellow, and white.

The pixels PXL may be arranged in a matrix format along columns extending in a first direction DR1 and rows extending in a second direction DR2 intersecting with the first direction DR1. However, the arrangement of the pixels PXL is not limited to a particular arrangement. In other words, the pixels PXL may be arranged in various other suitable forms.

The driver may provide a signal to each pixel PXL through the line component and thus control the operation of the pixel PXL. In FIG. 3, the line component is omitted for the sake of explanation.

The drivers may include a scan driver SDV to provide scan signals to the pixels PXL through scan lines, an emission driver to provide emission control signals to the pixels PXL through emission control lines, a data driver DDV to provide data signals to the pixels PXL through data lines, and a timing controller. The timing controller may control the scan driver SDV, the emission driver, and the data driver DDV.

The display device in accordance with an embodiment of the present disclosure may be employed in various suitable electronic devices. For instance, the display device may be included in, for example, a television, a notebook computer, a cellular phone, a smartphone, a smartpad, a portable multimedia player (PMP), a personal digital assistant (PDA), a navigation device, and/or various suitable kinds of wearable devices such as a smartwatch, etc.

Figure 4:
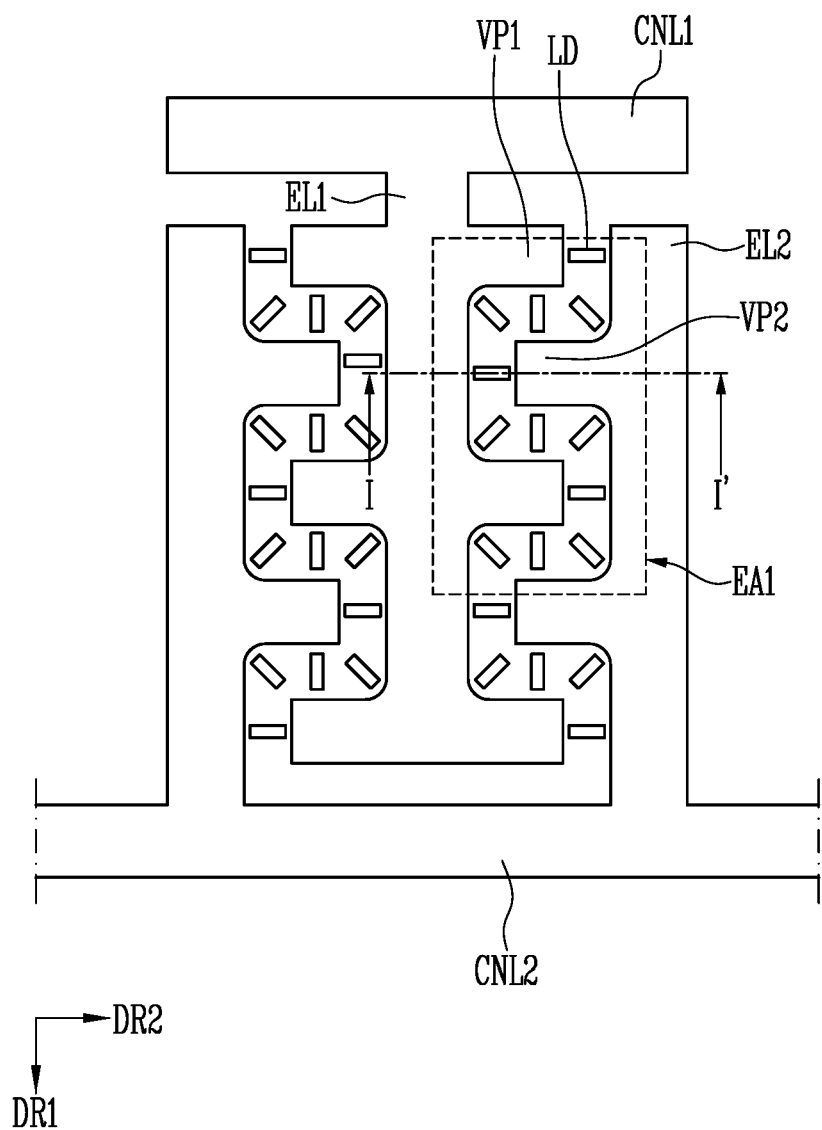
FIG. 4 is a plan view schematically illustrating a display element layer in accordance with an embodiment of the present disclosure.

FIG. 4 is a plan view schematically illustrating a display element layer in accordance with an embodiment of the present disclosure. For example, FIG. 4 schematically shows first and second electrodes EL1 and EL2, and light emitting elements LD included in the display element layer in accordance with an embodiment of the present disclosure. For the convenience of description, first and second banks and first and second contact electrodes included in the display element layer are not separately shown in FIG. 4.

Figure 5:
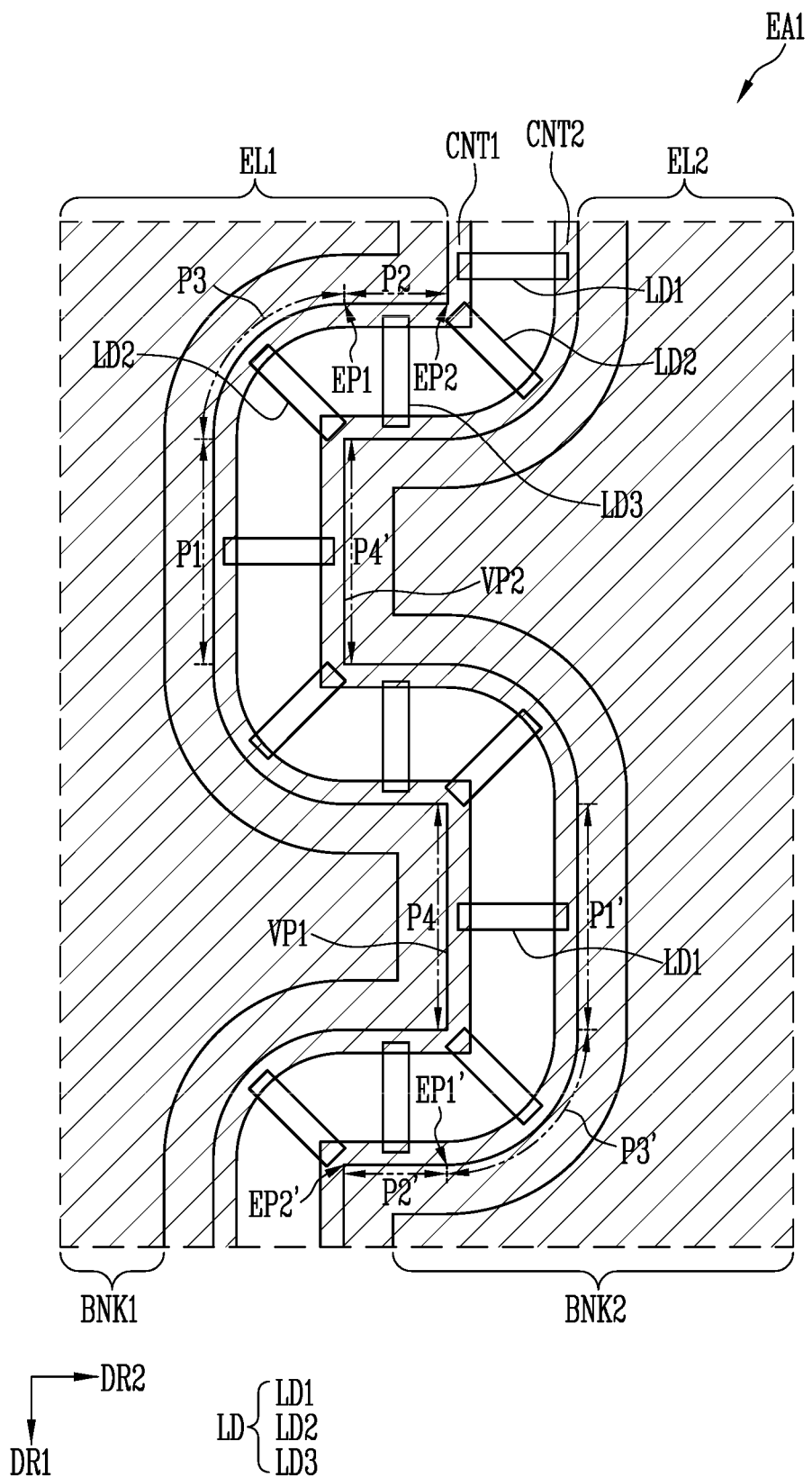
FIG. 5 is a plan view illustrating an embodiment of the display element layer in which a portion EA1 of FIG. 4 is enlarged.
Figure 6:
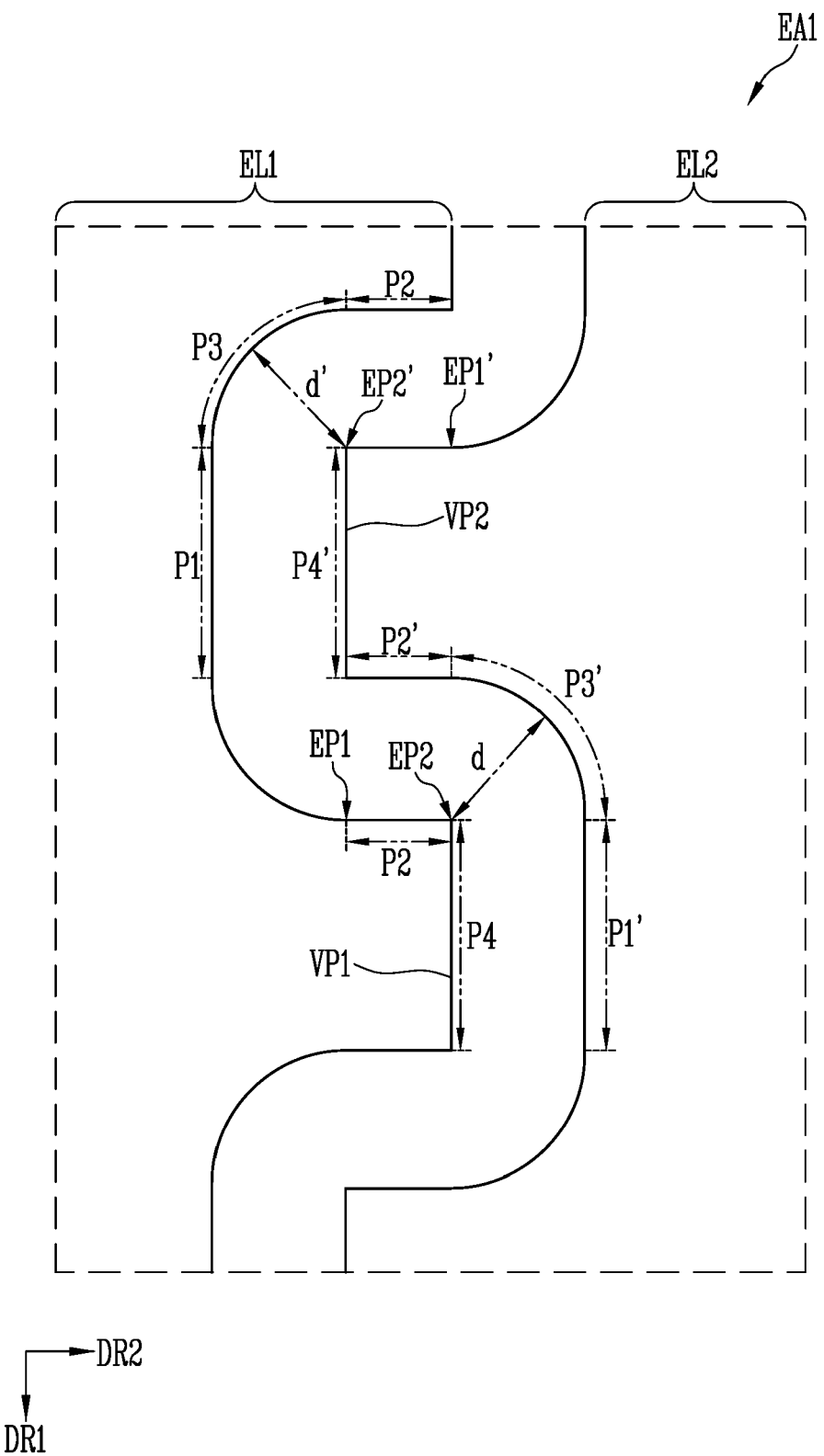
FIG. 6 is a plan view illustrating an embodiment of first and second electrodes shown in FIG. 5.
Figure 7A:
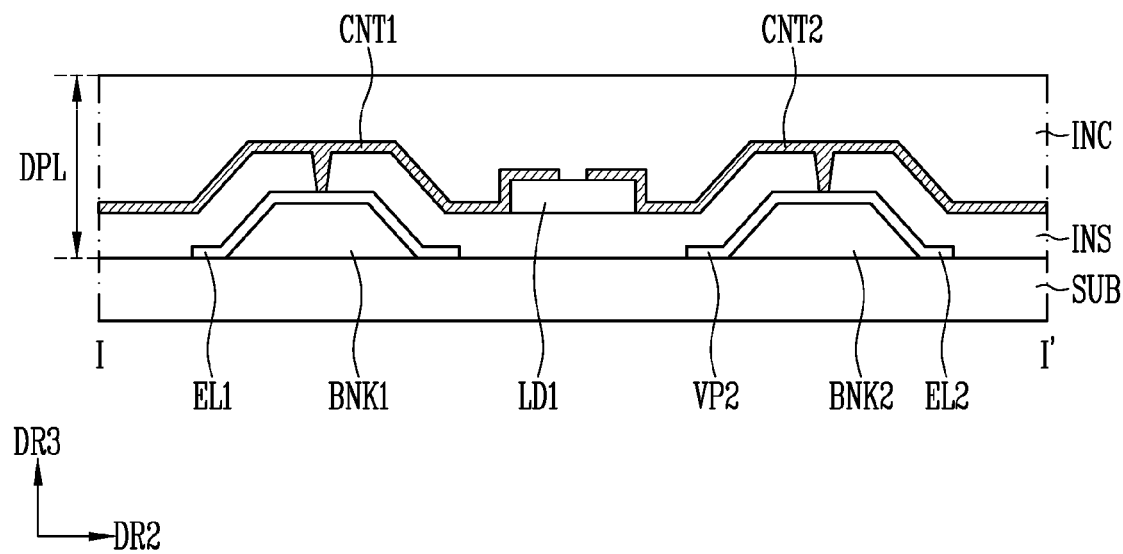
FIGS. 7A and 7B are cross-sectional views taken along line I-I' of FIG. 4.
Figure 7B:
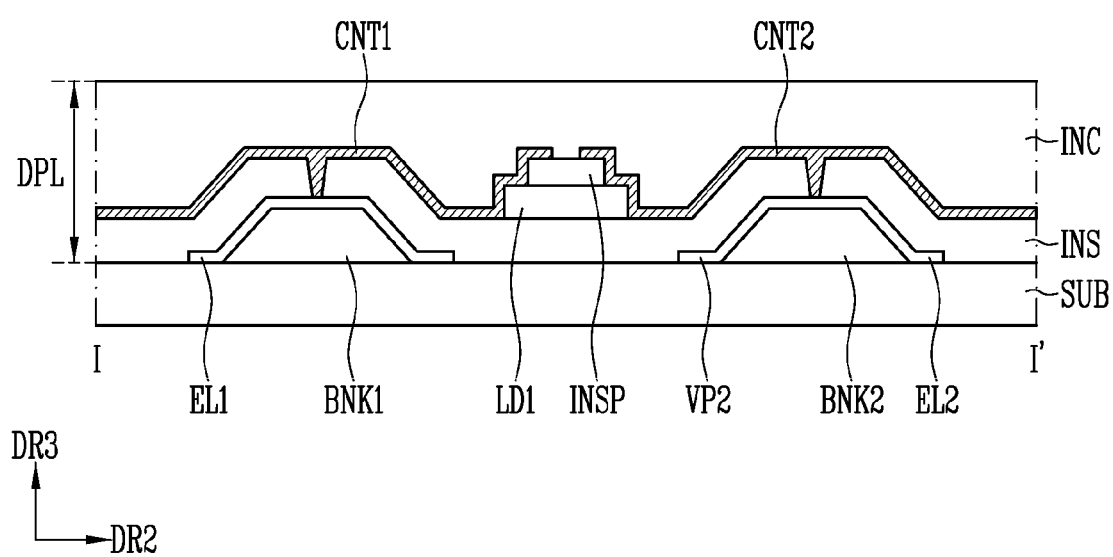

FIG. 5 is a plan view illustrating an embodiment of the display element layer in which portion EA1 of FIG. 4 is enlarged, and FIG. 6 is a plan view illustrating an embodiment of first and second electrodes shown in FIG. 5, and FIGS. 7A and 7B are cross-sectional views taken along line I-I' of FIG. 4.

As illustrated in FIGS. 4 to 7B, the display element layer DPL in accordance with an embodiment of the present disclosure may include first and second banks BNK1 and BNK2 provided on the substrate SUB, first and second electrodes EU and EL2, an insulating layer INS, light emitting elements LD, and first and second contact electrodes CNT1 and CNT2. The light emitting elements LD may include first, second, and third light emitting elements LD1, LD2, and LD3.

Hereinafter, when one of the first, second, and third light emitting elements LD1, LD2, and LD3 is optionally named, this is referred to as the light emitting element LD (e.g., it may refer to a single light emitting element). Meanwhile, when the first, second, and third light emitting elements LD1, LD2, and LD3 are collectively named, they are referred to as the light emitting elements LD (e.g., it may refer to a plurality of light emitting elements).

The substrate SUB may be a rigid substrate or a flexible substrate.

Examples of the rigid substrate may include a glass substrate, a quartz substrate, a glass ceramic substrate, and a crystalline glass substrate.

Examples of the flexible substrate may include a film substrate and a plastic substrate, each of which includes a polymer organic material. For example, the flexible substrate may include one selected from polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). Furthermore, the flexible substrate may include fiber glass reinforced plastic (FRP).

In some embodiments, a material applied to the substrate SUB may have resistance (e.g., thermal resistance) to high treatment temperatures during a process of fabricating the display device. In various embodiments of the present disclosure, the entirety or at least a portion of the substrate SUB may have flexibility (e.g., may be flexible).

The display element layer DPL may include a buffer layer provided on the substrate SUB. For example, the above-described first and second banks BNK1 and BNK2, first and second electrodes EL1 and EL2, insulating layer INS, light emitting elements LD, and first and second contact electrodes CNT1 and CNT2 may be provided on the buffer layer.

The buffer layer may prevent or reduce the diffusion of impurities into the light emitting elements LD. The buffer layer may be provided in a single layer structure or a multilayer structure having at least two or more layers. In the case where the buffer layer has a multilayer structure, the respective layers may be formed of the same material or different materials. In some embodiments, the buffer layer may be omitted depending on the material of the substrate SUB or processing conditions.

On the substrate SUB, the first electrode EL1 and the second electrode EL2 may extend in the first direction DR1, and may be spaced apart from each other in the second direction DR2. The light emitting elements LD may be electrically coupled to the first and second electrodes EL1 and EL2.

As illustrated in FIGS. 4 to 6, the first electrode EL1 may include first protrusions VP1 that protrude toward the second electrode EL2 in a plane and are spaced apart from each other in the first direction DR1.

The first electrode EL1 may include a first portion P1 located between the first protrusions VP1 in the first direction DR1. For example, the first portion P1 may be a side of the first electrode EL1 located between the first protrusions VP1. In various embodiments of the present disclosure, the first portion P1 of the first electrode EL1 may be provided in parallel (e.g., substantially in parallel) with the first direction DR1. However, the direction in which the first portion P1 of the first electrode EL1 is provided is not limited to the above-mentioned direction. For example, the first portion P1 of the first electrode EU may be provided to be inclined at a set or predetermined angle with respect to the first direction DR1. Furthermore, the first portion P1 of the first electrode EU and a fourth portion P4' of the second electrode EL2 may be opposite to each other (e.g., may face each other) in the plane.

The first electrode EL1 may include a second portion P2 corresponding to a side of each of the first protrusions VP1. As illustrated in FIGS. 5 and 6, a side of each of the facing first protrusions VP1 in the first protrusions VP1 adjacent to each other in the first direction DR1 in the plane corresponds to a second portion P2 of the first electrode EL1. For example, the second portion P2 of the first electrode EU corresponds to a side of a first protrusion VP1 facing in the plane a side of an adjacent first protrusion VP1.

In various embodiments of the present disclosure, the second portion P2 of the first electrode EL1 may be provided in parallel (e.g., substantially in parallel) with the second direction DR2. However, the direction in which the second portion P2 of the first electrode EL1 is provided is not limited to the above-mentioned direction. For example, the second portion P2 of the first electrode EL1 may be provided to be inclined at a set or predetermined angle with respect to the second direction DR2.

The first electrode EL1 may include a third portion P3 coupled between the first portion P1 and a first end EP1 of the second portion P2. The third portion P3 may be a side of the first electrode EL1 located between the first portion P1 and the second portion P2.

The first electrode EL1 may include a fourth portion P4 extending from a second end EP2 of the second portion P2 of the first electrode EL1. As illustrated in FIGS. 5 and 6, a side of the first protrusion VP1 facing the second electrode EL2 in the second direction DR2 corresponds to the fourth portion P4 of the first electrode EL1. Thus, the first protrusion VP1 may form the second portion P2 and the fourth portion P4 of the first electrode EL1. For example, the first protrusion VP1 may include, or be defined by, the second portion P2 and the fourth portion P4 of the first electrode EL1.

In various embodiments of the present disclosure, the fourth portion P4 of the first electrode EL1 may be provided in parallel (e.g., substantially in parallel) with the first direction DR1. However, the direction in which the fourth portion P4 of the first electrode EL1 is provided is not limited to the above-mentioned direction. For example, the fourth portion P4 of the first electrode EL1 may be provided to be inclined at a set or predetermined angle with respect to the first direction DR1.

As illustrated in FIGS. 4 to 6, the second electrode EL2 may include second protrusions VP2 that protrude toward the first electrode EL1 in the plane and are spaced apart from each other in the first direction DR1.

The second electrode EL2 may include a first portion P1' located between the second protrusions VP2 in the first direction DR1. For example, the first portion P1' may be a side of the second electrode EL2 located between the second protrusions VP2. In various embodiments of the present disclosure, the first portion P1' of the second electrode EL2 may be provided in parallel (e.g., substantially in parallel) with the first direction DR1. However, the direction in which the first portion P1' of the second electrode EL2 is provided is not limited to the above-mentioned direction. For example, the first portion P1' of the second electrode EL2 may be provided to be inclined at a set or predetermined angle with respect to the first direction DR1. Furthermore, the first portion P1' of the second electrode EL2 and the fourth portion P4 of the first electrode EL1 may be opposite to each other (e.g., face each other) in the plane.

The second electrode EL2 may include a second portion P2' corresponding to a side of each of the second protrusions VP2. As illustrated in FIGS. 5 and 6, a side of each of the facing second protrusions VP2 in the second protrusions VP2 adjacent to each other in the first direction DR1 in the plane corresponds to a second portion P2' of the second electrode EL2. For example, the second portion P2' of the second electrode EL2 corresponds to a side of a second protrusion VP2 facing in the plane a side of an adjacent second protrusion VP2.

In various embodiments of the present disclosure, the second portion P2' of the second electrode EL2 may be provided in parallel (e.g., substantially in parallel) with the second direction DR2. However, the direction in which the second portion P2' of the second electrode EL2 is provided is not limited to the above-mentioned direction. For example, the second portion P2' of the second electrode EL2 may be provided to be inclined at a set or predetermined angle with respect to the second direction DR2.

The second electrode EL2 may include a third portion P3' coupled between the first portion P1' and a first end EP1' of the second portion P2'. The third portion P3' may be a side of the second electrode EL2 located between the first portion P1' and the second portion P2'.

The second electrode EL2 may include a fourth portion P4' extending from a second end EP2' of the second portion P2' of the second electrode EL2. As illustrated in FIGS. 5 and 6, a side of the second protrusion VP2 facing the first electrode EL1 in the second direction DR2 corresponds to the fourth portion P4' of the second electrode EL2. Thus, the second protrusion VP2 may form the second portion P2' and the fourth portion P4' of the second electrode EL2. For example, the second protrusion VP2 may include, or be defined by, the second portion P2' and the fourth portion P4' of the second electrode EL2.

In various embodiments of the present disclosure, the fourth portion P4' of the second electrode EL2 may be provided in parallel (e.g., substantially in parallel) with the first direction DR1. However, the direction in which the fourth portion P4' of the second electrode EL2 is provided is not limited to the above-mentioned direction. For example, the fourth portion P4' of the second electrode EL2 may be provided to be inclined at a set or predetermined angle with respect to the first direction DR1.

In various embodiments of the present disclosure, the first electrode EL1 is provided with the first protrusions VP1, and the second electrode EL2 is provided with the second protrusions VP2, so that the alignment of the light emitting elements LD between the first electrode EL1 and the second electrode EL2 can be improved.

When an alignment signal is applied to the first and second electrodes EL1 and EL2, an electric filed may concentrate on the first protrusion VP1 and the second protrusion VP2. In some embodiments, the electric field may concentrate on the most protruding portion of each of the first and second protrusions VP1 and VP2 (e.g., may concentrate on the respective portion of the first protrusion VP1 and the second protrusion VP2 that protrudes furthest from the first electrode EL1 and the second electrode EL2, respectively). For example, the electric field may concentrate on an edge portion of each of the first and second protrusions VP1 and VP2. Thereby, the light emitting elements LD may be effectively aligned between the first electrode EU and the second electrode EL2.

In various embodiments of the present disclosure, the first protrusion VP1 and the second protrusion VP2 may be alternately arranged in the first direction DR1. As illustrated in FIGS. 4 to 6, because the first protrusion VP1 and the second protrusion VP2 are alternately arranged in the first direction DR1, the alignment of the light emitting elements LD may be improved between the first electrode EL1 and the second electrode EL2. For example, when the alignment signal is applied to the first and second electrodes EL1 and EL2, the electric field may be strongly formed between the first protrusion VP1 and the second electrode EL2, between the second protrusion VP2 and the first electrode EL1, and between the first protrusion VP1 and the second protrusion VP2, and consequently, the light emitting elements LD may be effectively aligned between the first electrode EL1 and the second electrode EL2.

In various embodiments of the present disclosure, at least a portion of the second portion P2 of the first electrode EL1 and at least a portion of the second portion P2' of the second electrode EL2 may face each other in the first direction DR1. Referring to FIGS. 4 to 6, the first protrusion VP1 and the second protrusion VP2 may be alternately arranged in the first direction DR1, and concurrently (or simultaneously) a portion of the first protrusion VP1 and a portion of the second protrusion VP2 may be provided to face each other. In other words, at least a portion of the second portion P2 included in the first electrode EL1 and at least a portion of the second portion P2' included in the second electrode EL2 may overlap each other in the first direction DR1 in the plane.

At least a portion of the second portion P2 of the first electrode EU and at least a portion of the second portion P2' of the second electrode EL2 may be provided to face each other in the first direction DR1 in the plane, so that the number of the light emitting elements LD provided per unit area of the substrate SUB may be increased. When the alignment signal is applied to the first and second electrodes EL1 and EL2, a strong electric field may be formed between the second portion P2 of the first electrode EL1 and the second portion P2' of the second electrode EL2 that face each other.

As illustrated in FIGS. 4 and 5, the light emitting elements LD are provided between the first protrusion VP1 and the second protrusion VP2, so that an integration degree of the light emitting elements LD may be improved in the same area of the substrate SUB.

In various embodiments of the present disclosure, the third portions P3 and P3' of the first and second electrodes EL1 and EL2 may be provided in a curved shape in the plane. As illustrated in FIGS. 5 and 6, the third portion P3 of the first electrode EL1 may be curved concavely in a direction opposite to the direction of the first protrusion VP1 in the plane, and the third portion P3' of the second electrode EL2 may be curved concavely in a direction opposite to the direction of the second protrusion VP2 in the plane. For example, the third portion P3 of the first electrode EL1 may concavely curve away (e.g., at an angle, such as a 45 degree angle) in the plane from the direction in which the first protrusion VP1 protrudes, and the third portion P3' of the second electrode EL2 may concavely curve away (e.g., at an angle, such as a 45 degree angle) in the plane from the direction in which the second protrusion VP2 protrudes.

The third portion P3 of the first electrode EU may be curved concavely in a direction opposite to the direction of the first protrusion VP1, and the third portion P3' of the second electrode EL2 may be curved concavely in a direction opposite to the direction of the second protrusion VP2, thereby allowing the light emitting elements LD to be easily aligned between the first and second electrodes EL1 and EL2. For example, when the alignment signal is applied to each of the first and second electrodes EL1 and EL2, the light emitting elements LD that are irregularly provided on the substrate SUB may be more easily moved between the first and second electrodes EL1 and EL2, and be easily located in an area that is to be aligned.

Furthermore, the third portion P3 of the first electrode EL1 may be curved concavely in a direction opposite to the direction of the first protrusion VP1, and the third portion P3' of the second electrode EL2 may be curved concavely in a direction opposite to the direction of the second protrusion VP2, thereby allowing the first and second contact electrodes CNT1 and CNT2 to effectively come into contact with the light emitting elements LD.

For example, if the third portions P3 and P3' of the first and second electrodes EL1 and EL2 are not curved but form right angles, the first and second contact electrodes CNT1 and CNT2 may not easily come into contact with the light emitting elements LD at the third portions P3 and P3', which may have right angles.

On the other hand, according to an embodiment of the present disclosure, the third portion P3 of the first electrode EL1 may be curved concavely in a direction opposite to the direction of the first protrusion VP1, and the third portion P3' of the second electrode EL2 may be curved concavely in a direction opposite to the direction of the second protrusion VP2, thereby eliminating (or reducing) the contact blind spot and allowing the light emitting elements LD to easily come into contact with the first and second contact electrodes CNT1 and CNT2.

Referring to FIG. 4, the first electrode EL1 may be coupled to a first coupling line CNL1 or be formed integrally with the first coupling line CNL1. The first coupling line CNL1 may be electrically coupled to a power supply line to which the above-mentioned first driving power supply (see VDD of FIGS. 2A and 2B) is applied.

The second electrode EL2 may be coupled to a second coupling line CNL2, or be formed integrally with the second coupling line CNL2. The second coupling line CNL2 may be electrically coupled to a power supply line to which the above-mentioned second driving power supply (see VSS of FIGS. 2A and 2B) is applied.

In various embodiments of the present disclosure, the display element layer DPL may include the first and second banks BNK1 and BNK2 provided on the substrate SUB.

As illustrated in FIG. 5, the first and second banks BNK1 and BNK2 may extend in the first direction DR1, may be provided on the substrate SUB while being spaced apart from each other in the second direction DR2, and may form the unit emission areas.

The two banks BNK1 and BNK2 that are adjacent to each other on the substrate SUB may be spaced apart from each other by a set or predetermined distance in the second direction DR2. For example, the two first and second banks BNK1 and BNK2 adjacent to each other may be provided on the substrate SUB to be spaced apart from each other by a length of the light emitting element LD or more.

The first and second banks BNK1 and BNK2 may include an inorganic insulating layer made of an inorganic material or an organic insulating layer made of an organic material. In an embodiment, the first and second banks BNK1 and BNK2 may include a single organic insulating layer and/or a single inorganic insulating layer, but the present disclosure is not limited thereto. In an embodiment, the first and second banks BNK1 and BNK2 may be provided in the form of a multilayer structure by stacking at least one organic insulating layer and/or at least one inorganic insulating layer. However, the material of the first and second banks BNK1 and BNK2 is not limited to the above-described embodiments. According to an embodiment, the first and second banks BNK1 and BNK2 may include conductive material.

As illustrated in FIGS. 7A and 7B, the first and second banks BNK1 and BNK2 each may have a cross-section of a trapezoid which is reduced in width from the bottom to the top in a third direction DR3, but the present disclosure is not limited thereto. In some embodiments, the first and second banks BNK1 and BNK2 each may have a curved surface having a semi-circular or a semi-elliptical cross-section which is reduced in width from the bottom to the top. In the present disclosure, the shape and/or the inclination of each of the first and second banks BNK1 and BNK2 may be changed in various suitable ways rather than being particularly limited.

Referring to FIGS. 5, 7A and 7B, the first electrode EL1 may be provided on the first bank BNK1, and the second electrode EL2 may be provided on the second bank BNK2. Here, the first electrode EL1 may have a shape corresponding to the inclination of the first bank BNK1, and the second electrode EL2 may have a shape corresponding to the inclination of the second bank BNK2. For example, each of the first and second electrodes EU and EL2 may include a protruding portion corresponding to the first and second banks BNK1 and BNK2, and a flat portion corresponding to the substrate SUB.

In various embodiments of the present disclosure, the first bank BNK1 may have a planar shape corresponding to a planar shape of the first electrode EL1, and the second bank BNK2 may have a planar shape corresponding to a planar shape of the second electrode EL2.

In the present disclosure, the corresponding shapes may refer to substantially the same or similar shapes.

As illustrated in FIG. 5, the first bank BNK1 may overlap the first electrode EL1, and have a planar shape that is similar to but is smaller than the planar shape of the first electrode EL1. Furthermore, the second bank BNK2 may overlap the second electrode EL2, and have a planar shape that is similar to but is smaller than the planar shape of the second electrode EL2.

As the first bank BNK1 has a planar shape corresponding to the planar shape of the first electrode EL1, the first bank BNK1 may include a first bank protrusion having a shape corresponding to the planar shape of the first protrusion VP1. Furthermore, the first bank BNK1 may include first to fourth portions having planar shapes corresponding to planar shapes of the first to fourth portions P1, P2, P3, and P4 of the first electrode EL1, respectively.

As the second bank BNK2 has a planar shape corresponding to the planar shape of the second electrode EL2, the second bank BNK2 may include a second bank protrusion having a shape corresponding to the planar shape of the second protrusion VP2. Furthermore, the second bank BNK2 may include first to fourth portions having planar shapes corresponding to planar shapes of the first to fourth portions P1', P2', P3', and P4' of the second electrode EL2, respectively.

In various embodiments of the present disclosure, the first electrode EL1 and the second electrode EL2 each may be a reflective electrode. The first and second electrodes EL1 and EL2, they are reflective electrodes, may guide light, emitted from the light emitting elements LD, from the substrate SUB toward the display element layer DPL (e.g. front surface).

The first and second banks BNK1 and BNK2 and the first and second electrodes EL1 and EL2 each may function as a reflective member that guides light emitted from the light emitting elements LD in a suitable or desired direction to improve the light efficiency of the display device. For example, the first and second banks BNK1 and BNK2 and the first and second electrodes EL1 and EL2 each may function as a reflective member that guides light emitted from the light emitting elements LD toward the front of the display device (e.g. in an image display direction) to improve the light output efficiency of the light emitting elements LD.

The first electrode EL1 and the second electrode EL2, when they are reflective electrodes, may include a conductive (e.g., electrically conductive) material having high light reflectivity. The conductive material having the high light reflectivity may include metal, for example, Ag, Mg, Al, Pt, Pd, Au, Ni, Nd, Ir, Cr, Ti, and/or an alloy thereof.

In an embodiment, each of the first and second electrodes EL1 and EL2 may include a transparent conductive material. The transparent conductive material may include a conductive oxide such as indium tin oxide (ITO), indium zinc oxide (IZO), zinc oxide (ZnO), and/or indium tin zinc oxide (ITZO), and/or a conductive polymer such as PEDOT. When each of the first and second electrodes EU and EL2 includes the transparent conductive material, a separate conductive layer made of an opaque metal so as to reflect the light emitted from the light emitting elements LD toward the front of the display device (e.g. in the image display direction) may be further included. However, the material of the first electrode EL1 and the second electrode EL2 is not limited to the above-mentioned materials.

In some embodiments, a bank pattern may be provided in a peripheral area of a pixel area of each pixel PXL.

The bank pattern may enclose at least one side of the peripheral area included in the pixel area of each of the pixels PXL. The bank pattern may be a structure that defines (or partitions) each pixel PXL and the emission area of each of the pixels PXL adjacent thereto. An example of the bank pattern may be a pixel defining layer. Such a bank pattern may include at least one light shielding material and/or reflective material to prevent or reduce leakage of light from between each pixel PXL and the pixels PXL adjacent thereto. Consequently, light leakage defects can be prevented or (or a likelihood or degree of such defects can be reduced). According to an embodiment, in order to further improve the efficiency of the light emitted from each pixel PXL, a reflective material layer may be formed on the bank pattern. According to an embodiment, the bank pattern may be formed on a layer different from or the same as that of the first and second banks BNK1 and BNK2.

In various embodiments of the present disclosure, the display element layer DPL may include the insulating layer INS to cover the first and second electrodes EU and EL2. For example, the insulating layer INS may be provided on a surface of the substrate SUB including the first and second banks BNK1 and BNK2 and the first and second electrodes EL1 and EL2. Because the first and second electrodes EL1 and EL2 are covered by the insulating layer INS, the first and second electrodes EL1 and EL2 may not be affected (or substantially not affected) by static electricity introduced from the outside.

In some embodiments, the insulating layer INS may include an organic insulating layer, an inorganic insulating layer, or the organic insulating layer on the inorganic insulating layer. Here, the inorganic insulating layer may include at least one selected from silicon oxide SiOx, silicon nitride SiNx, silicon oxynitride SiON, and metal oxide such as AlOx.

The organic insulating layer may include an organic insulating material that may transmit light. The organic insulating layer may include, for example, at least one selected from polyacrylates resin, epoxy resin, phenolic resin, polyamides resin, polyimides rein, unsaturated polyesters resin, poly-phenylene ethers resin, poly-phenylene sulfides resin, and benzocyclobutene resin.

In various embodiments of the present disclosure, the insulating layer INS may be formed of the inorganic insulating layer that is suitable for protecting the light emitting elements LD from the pixel circuit layer of each pixel PXL, but the present disclosure is not limited thereto. In an embodiment, the insulating layer INS may be formed of the organic insulating layer that is suitable for planarizing a support surface of the light emitting elements LD.

The light emitting elements LD may be provided between the first electrode EL1 and the second electrode EL2 on the insulating layer INS. The light emitting elements LD may be provided on a layer different from that of the first and second electrodes EL1 and EL2.

In the description of embodiments of the present disclosure, the expression "components are formed and/or provided on the same layer" may mean that the components are formed through the same process, and the expression "components are formed and/or provided on different layers" may mean that the components are formed through different processes.

In various embodiments of the present disclosure, the light emitting elements LD may be provided on the insulating layer INS and the alignment signal may be applied to the first and second electrodes EU and EL2, so that the light emitting elements may be aligned between the first and second electrodes EL1 and EL2.

The light emitting elements LD may be put into the insulating layer INS overlapping the emission area of each of the pixels PXL through an inkjet printing method, a slit coating method, and/or other various suitable methods. For example, the light emitting elements LD may be mixed with a volatile solvent and then supplied to the emission area of each pixel PXL through the inkjet printing method and/or the slit coating method.

For example, an inkjet nozzle may be on the insulating layer INS, and a solvent in which the plurality of light emitting elements LD is mixed may be put into the emission area of each of the pixels PXL through the inkjet nozzle. Here, the solvent may be any one selected from acetone, water, alcohol, and toluene, but the present disclosure is not limited thereto. For example, the solvent may have the form of ink or paste. A method of putting the light emitting elements LD into the emission area of each of the pixels PXL is not limited to the above-described embodiment. The method of putting the light emitting elements LD may be changed in various suitable ways.

After the light emitting elements LD are put into the emission area of each of the pixels PXL, the solvent may be removed.

After the light emitting elements LD are provided on the insulating layer INS, the alignment signal may be applied to the first and second electrodes EL1 and EL2, so that the light emitting elements LD may be aligned between the first and second electrodes EL1 and EL2.

In other words, the first and second electrodes EU and EL2 may function as an alignment electrode (or alignment line) for aligning the light emitting elements LD. If the alignment signal is applied to each of the first and second electrodes EL1 and EL2, the self-alignment of the light emitting elements LD may be induced by an electric field formed between the first electrode EL1 and the second electrode EL2.

A first alignment signal applied to the first electrode EL1 and a second alignment signal applied to the second electrode EL2 may be signals having a voltage difference and/or a phase difference such that the light emitting elements LD may be aligned between the first electrode EL1 and the second electrode EL2. For example, the first alignment signal and the second alignment signal may have different voltage levels. Furthermore, at least some of the first alignment signal and the second alignment signal may be alternating current (AC) signals, but the present disclosure is not limited thereto.

Furthermore, when the light emitting elements LD are aligned, the light emitting elements LD may be aligned to be relatively biased between the first electrode EL1 and the second electrode EL2, by controlling the alignment signal (or alignment voltage) applied to the first electrode EL1 and the second electrode EL2 or forming a magnetic field. For example, each of the light emitting elements LD may be aligned such that a first end thereof faces the first electrode EU and a second end thereof faces the second electrode EL2. In contrast, each of the light emitting elements LD may be aligned such that the first end thereof faces the second electrode EL2 and the second end thereof faces the first electrode EL1.

In various embodiments of the present disclosure, the light emitting elements LD may include a first light emitting element LD1 provided between the first portion P1 of the first electrode EL1 and the fourth portion P4' of the second electrode EL2, or between the first portion P1' of the second electrode EL2 and the fourth portion P4 of the first electrode EL1.

If the alignment signal is applied to each of the first and second electrodes EL1 and EL2, the electric field may concentrate on the first and second protrusions VP1 and VP2. Here, the fourth portion P4 of the first electrode EU may be opposite to (e.g., may face) the first portion P1' of the second electrode EL2, and the fourth portion P4' of the second electrode EL2 may be opposite to (e.g., may face) the first portion P1 of the first electrode EL1. Thereby, the first light emitting element may be effectively aligned between the first portion P1 of the first electrode EU and the fourth portion P4' of the second electrode EL2, or between the first portion P1' of the second electrode EL2 and the fourth portion P4 of the first electrode EL1.

In various embodiments of the present disclosure, the light emitting elements LD may include a second light emitting element LD2 provided between the second end EP2 of the second portion P2 of the first electrode EL1 and the third portion P3' of the second electrode EL2, or between the second end EP2' of the second portion P2' of the second electrode EL2 and the third portion P3 of the first electrode EU.

If the alignment signal is applied to each of the first and second electrodes EL1 and EL2, the electric field may concentrate on the first and second protrusions VP1 and VP2. For example, the electric field may concentrate on the seconds ends EP2 and EP2' of the second portions P2 and P2'. In this case, as illustrated in FIGS. 5 and 6, the second end EP2 of the second portion P2 included in the first electrode EL1 may be opposite to (e.g., may face) the third portion P3' of the second electrode EL2, and the second end EP2' of the second portion P2' included in the second electrode EL2 may be opposite to (e.g., may face) the third portion P3 of the first electrode EL1. Thereby, the second light emitting element LD2 may be effectively aligned between the second end EP2 of the second portion P2 of the first electrode EL1 and the third portion P3' of the second electrode EL2, or between the second end EP2' of the second portion P2' of the second electrode EL2 and the third portion P3 of the first electrode EL1.

In an embodiment of the present disclosure, a distance d from the second end EP2 of the second portion P2 of the first electrode EL1 to the third portion P3' of the second electrode EL2 may be constant (e.g., substantially constant). As illustrated in FIG. 6, distances d from the second end EP2 of the second portion P2 of the first electrode EL1 to any points of the third portion P3' included in the second electrode EL2 may be the same (e.g., substantially the same). For instance, the third portion P3 of the first electrode EL1 may have an arc shape having the second end EP2' of the second portion P2' of the second electrode EL2 as a center point.

A distance d' from the second end EP2' of the second portion P2' of the second electrode EL2 to the third portion P3 of the first electrode EL1 may be constant (e.g., substantially constant). As illustrated in FIG. 6, distances d' from the second end EP2' of the second portion P2' of the second electrode EL2 to any points of the third portion P3 included in the first electrode EL1 may be the same (e.g., substantially the same). For instance, the third portion P3' of the second electrode EL2 may have an arc shape having the second end EP2 of the second portion P2 of the first electrode EL1 as a center point.

The distance d from the second end EP2 of the second portion P2 of the first electrode EL1 to the third portion P3' of the second electrode EL2 is constant (e.g., substantially constant), and the distance d' from the second end EP2' of the second portion P2' of the second electrode EL2 to the third portion P3 of the first electrode EL1 is constant (e.g., substantially constant), thereby eliminating (or reducing) a contact blind spot and thereby allowing the second light emitting element LD2 to easily come into contact with the first and second contact electrodes CNT1 and CNT2.

Moreover, a distance between the first electrode EL1 and the second electrode EL2 that are adjacent to each other in the plane may be formed to be constant (e.g., substantially constant). A distance between the first electrode EL1 and the second electrode EL2 is formed to be constant (e.g., substantially constant), thereby improving the alignment of the light emitting elements LD between the first and second electrodes EL1 and EL2 and allowing the aligned light emitting elements LD to more easily come into contact with the first and second contact electrodes CNT1 and CNT2.

In various embodiments of the present disclosure, the second light emitting element LD2 may be arranged diagonally with respect to the first direction DR1 and the second direction DR2. As illustrated in FIG. 5, the second light emitting element LD2 may be aligned while being inclined at a set or predetermined angle with respect to the first direction DR1 and the second direction DR2 between the second end EP2 of the second portion P2 of the first electrode EL1 and the third portion P3' of the second electrode EL2, or between the second end EP2' of the second portion P2' of the second electrode EL2 and the third portion P3 of the first electrode EL1.

In various embodiments of the present disclosure, the light emitting elements LD may include a third light emitting element LD3 provided between the second portion P2 of the first electrode EL1 and the second portion P2' of the second electrode EL2.

If the alignment signal is applied to each of the first and second electrodes EL1 and EL2, the electric field may concentrate on the first and second protrusions VP1 and VP2. Here, as illustrated in FIGS. 5 and 6, at least a portion of the second portion P2 included in the first electrode EL1 and at least a portion of the second portion P2' included in the second electrode EL2 may face each other in the first direction DR1. Thereby, the third light emitting element LD3 may be effectively aligned between the second portion P2 of the first electrode EL1 and the second portion P2' of the second electrode EL2.

In various embodiments of the present disclosure, the display element layer DPL may include a first contact electrode CNT1 that electrically couples the first electrode EL1 to the light emitting elements LD, and a second contact electrode CNT2 that electrically couples the second electrode EL2 to the light emitting elements LD. After the light emitting elements LD are aligned, the first and second contact electrodes CNT1 and CNT2 may function as driving electrodes for driving the light emitting elements LD.

As illustrated in FIGS. 7A and 7B, the first and second contact electrodes CNT1 and CNT2 and the light emitting elements LD may be provided on the insulating layer INS. Through a contact hole formed through the insulating layer INS, the first contact electrode CNT1 and the first electrode EL1 may be coupled to each other, and the second contact electrode CNT2 and the second electrode EL2 may be coupled to each other.

Although it is illustrated in FIGS. 7A and 7B that the first and second contact electrodes CNT1 and CNT2 are provided on the same layer on the insulating layer INS, the first and second contact electrodes CNT1 and CNT2 may be provided on different layers. If the first and second contact electrodes CNT1 and CNT2 are provided on the different layers, a separate insulating layer may be provided between the first contact electrode CNT1 and the second contact electrode CNT2.

The first contact electrode CNT1 may be provided on the first end of the light emitting element LD, and the second contact electrode CNT2 may be provided on the second end thereof. Thereby, the light emitting elements LD may be electrically coupled to the first and second electrodes EU and EL2.

The first and second contact electrodes CNT1 and CNT2 may include at least one of various suitable transparent conductive materials, e.g., ITO, IZO, and ITZO, and may be substantially transparent or translucent to satisfy a set or predetermined transmittance (e.g., light transmittance).

The first and second contact electrodes CNT1 and CNT2 may be formed of transparent conductive material so that light emitted from each light emitting element LD may be transmitted without a loss (e.g., substantially without a loss).

However, the material of the first and second contact electrodes CNT1 and CNT2 is not limited to the above-described embodiments. According to an embodiment, the first and second contact electrodes CNT1 and CNT2 may be formed of various suitable opaque conductive materials.

In various embodiments of the present disclosure, the first contact electrode CNT1 may have a planar shape corresponding to the planar shape of the first electrode EL1. For example, the first contact electrode CNT1 may overlap the first electrode EL1, and have a planar shape that is similar to but is larger than that of the first electrode EL1.

As the first contact electrode CNT1 has a planar shape corresponding to the planar shape of the first electrode EL1, the first contact electrode CNT1 may include a first contact electrode protrusion having a shape corresponding to the planar shape of the first protrusion VP1. Furthermore, the first contact electrode CNT1 may include first to fourth portions having planar shapes corresponding to planar shapes of the first to fourth portions P1, P2, P3, and P4 of the first electrode EL1, respectively.

The second contact electrode CNT2 may have a planar shape corresponding to the planar shape of the second electrode EL2. For example, the second contact electrode CNT2 may overlap the second electrode EL2, and have a planar shape that is similar to but is larger than that of the second electrode EL2.

As the second contact electrode CNT2 has a planar shape corresponding to the planar shape of the second electrode EL2, the second contact electrode CNT2 may include a second contact electrode protrusion having a shape corresponding to the planar shape of the second protrusion VP2. Furthermore, the second contact electrode CNT2 may include first to fourth portions having planar shapes corresponding to planar shapes of the first to fourth portions P1', P2', P3', and P4' of the second electrode EL2, respectively.

Because the first contact electrode CNT1 overlaps the first electrode EL1 while having the planar shape that is similar to but larger than that of the first electrode EL1 and the second contact electrode CNT2 overlaps the second electrode EL2 while having the planar shape that is similar to but larger than that of the second electrode EL2, the contact electrodes may more easily come into contact with the exposed light emitting elements LD on the insulating layer INS. In some embodiments, as the first and second contact electrodes CNT1 and CNT2 have the above-described shape, the contact blind spot is eliminated or reduced, thereby allowing the light emitting elements LD to more easily come into contact with the first and second electrodes CNT1 and CNT2. Thereby, the light emitting efficiency of the display device can be further improved, by reducing the number of light emitting elements LD that are darkened due to a defective contact.

Referring to FIG. 7B, the display element layer DPL may include an insulating pattern INSP provided on the light emitting elements LD. The insulating pattern INSP may prevent the light emitting elements LD provided between the first and second electrodes EL1 and EL2 from being dislodged from the aligned position (or a likelihood or degree of such dislodging can be reduced).

The insulating pattern INSP may be provided to extend in the first direction DR1. The insulating pattern INSP may overlap a portion of each of the light emitting elements LD to expose the first and second ends of the light emitting element LD. The insulating pattern INSP may be formed of transparent insulating material to allow light emitted from the light emitting elements LD to be transmitted without a loss.

The insulating pattern INSP may be formed of a single layer or a multilayer structure, and may include an inorganic insulating layer including at least one inorganic material or an organic insulating layer including at least one organic material. The insulating pattern INSP may further fix each of the light emitting elements LD arranged in the emission area of each pixel PXL.

In an embodiment of the present disclosure, the insulating pattern INSP may include an inorganic insulating layer that is suitable for protecting the active layer 12 of each of the light emitting elements LD from external oxygen or water. However, the present disclosure is not limited to this. The insulating pattern INSP may include an organic insulating layer containing an organic material depending on design conditions of the display device to which the light emitting elements LD are applied.

In some embodiments, when an empty gap (or space) is present between the insulating layer INS and the light emitting elements LD in the third direction DR3 before forming the insulation pattern INSP, the empty gap may be filled with the insulating pattern INSP in the process of forming the insulating pattern INSP. Thus, the insulating pattern INSP may form an organic insulating layer that is suitable for filling the empty gap between the insulating layer INS and the light emitting elements LD.

As illustrated in FIG. 7B, the first contact electrode CNT1 may be provided on the first end of the light emitting element LD exposed by the insulating pattern INSP, and the second contact electrode CNT2 may be provided on the second end thereof. Furthermore, the first and second contact electrodes CNT1 and CNT2 may also be provided on some area of the insulating pattern INSP. Here, the first contact electrode CNT1 and the second contact electrode CNT2 may be spaced apart from each other on the insulating pattern INSP. As the first and second contact electrodes CNT1 and CNT2 are provided on some area of the insulating pattern INSP, the position of the light emitting elements LD aligned between the first and second electrodes EL1 and EL2 may be more stably fixed.

In various embodiments of the present disclosure, the display element layer DPL may include the first and second electrodes EL1 and EL2, the first and second contact electrodes CNT1 and CNT2, and an encapsulation layer INC provided on a surface of the substrate SUB on which the light emitting elements LD are provided. The encapsulation layer INC covers the first and second electrodes EL1 and EL2, the first and second contact electrodes CNT1 and CNT2, and the light emitting elements LD to prevent or reduce exposure of the light emitting elements to the outside, thereby preventing or reducing corrosion of the first and second electrodes EL1 and EL2, the first and second contact electrodes CNT1 and CNT2, and the light emitting elements LD.

The encapsulation layer INC may include transparent insulating material and thus allow light to pass therethrough. The transparent insulating material may include organic material or inorganic material. For example, the encapsulation layer INC may be formed of transparent insulating material such as IZO so as to minimize or reduce the loss of light that is emitted from the light emitting elements LD and then is reflected in the image display direction of the display device by the first and second electrodes EL1 and EL2.

Furthermore, the encapsulation layer INC may be a planarization layer that compensates for steps that are generated by components located thereunder, for example, the light emitting elements LD, the first and second banks BNK1 and BNK2, the first and second electrodes EL1 and EL2, and the first and second contact electrodes CNT1 and CNT2.

In various embodiments of the present disclosure, an overcoat layer may be provided on the encapsulation layer INC. The overcoat layer may be an encapsulating layer provided to prevent or reduce penetration of oxygen, water, or the like into the light emitting elements LD.

In various embodiments of the present disclosure, the above-described first and second banks BNK1 and BNK2, first and second electrodes EL1 and EL2, light emitting element LD, insulating pattern INSP, and first and second contact electrodes CNT1 and CNT2 may be provided on each of the pixels PXL.

Figure 8:
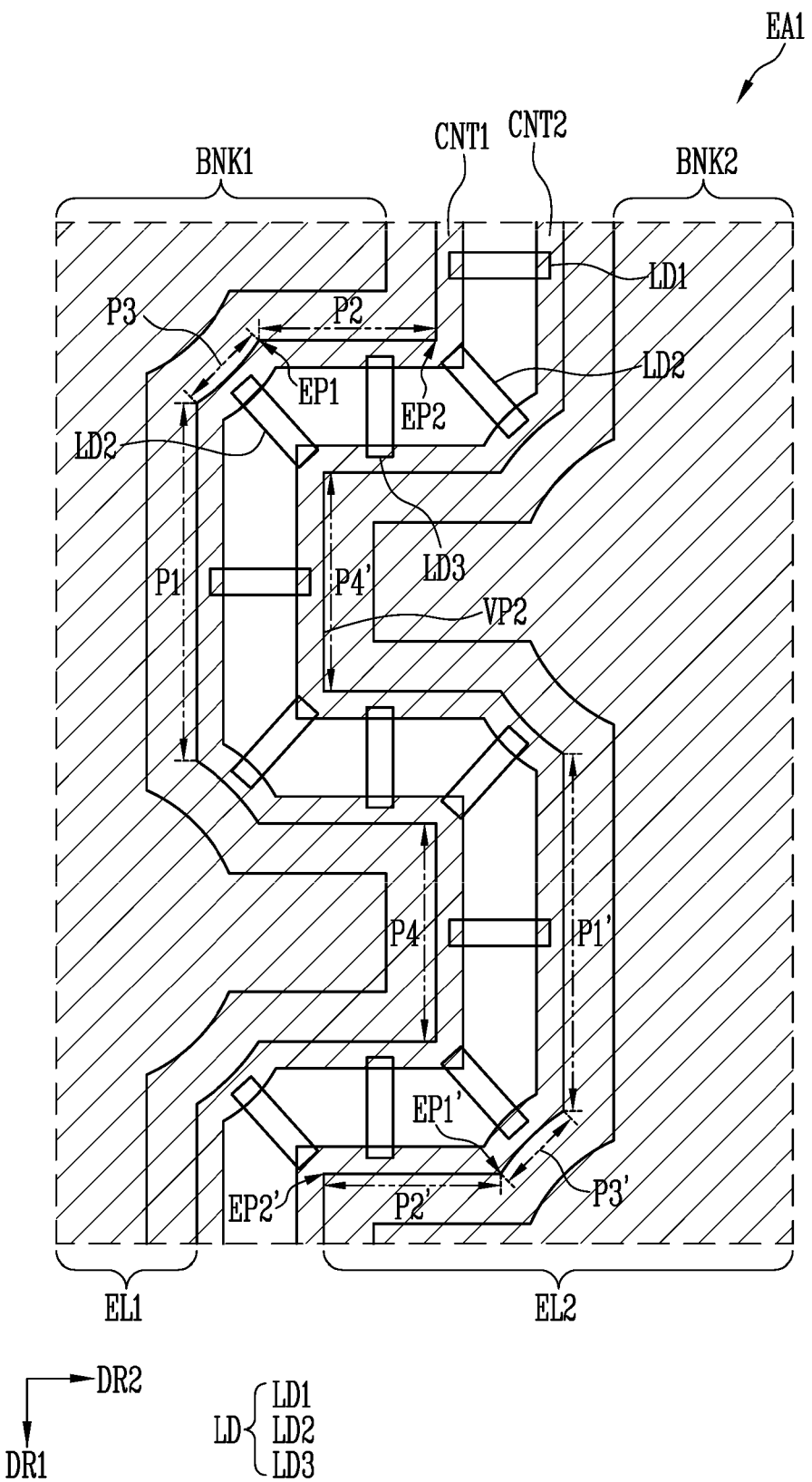
FIG. 8 is a plan view illustrating an embodiment of a display element layer in which portion EA1 of FIG. 4 is enlarged.

FIG. 8 is a plan view illustrating an embodiment of a display element layer in which portion EA1 of FIG. 4 is enlarged.

In order to reduce duplicated description, components that are not mentioned in the display device according to the above-described embodiment will be mainly described. Components which are not separately explained in the following description of the present embodiment comply with that of the foregoing embodiments. The same reference numerals will be used to designate the same components, and similar reference numerals will be used to designate a similar components. The same applies to the following embodiment.

Referring to FIGS. 4 to 8, the display element layer DPL in accordance with an embodiment of the present disclosure may include first and second banks BNK1 and BNK2 provided on the substrate SUB, first and second electrodes EL1 and EL2, an insulating layer INS, light emitting elements LD, and first and second contact electrodes CNT1 and CNT2. The light emitting elements LD may include first, second, and third light emitting elements LD1, LD2, and LD3.

As shown in FIG. 8, in an embodiment, in the plane, a third portion P3 of the first electrode EL1 may be convexly curved toward a second end EP2' of a second portion P2' of the second electrode EL2. In the plane, a third portion P3' of the second electrode EL2 may be convexly curved toward a second end EP2 of a second portion P2 of the first electrode EL1.

The third portion P3 of the first electrode EL1 is convexly curved toward the second end EP2' of the second portion P2' of the second electrode EL2, and the third portion P3' of the second electrode EL2 is convexly curved toward the second end EP2 of the second portion P2 of the first electrode EL1, so that the electric field may concentrate on the third portions P3 and P3' when the alignment signal is applied to the first and second electrodes EL1 and EL2. Thereby, the second light emitting element LD2 may be effectively aligned between the second end EP2 of the second portion P2 of the first electrode EL1 and the third portion P3' of the second electrode EL2, or between the second end EP2' of the second portion P2' of the second electrode EL2 and the third portion P3 of the first electrode EU.

Here, in the plane, a distance between the third portion P3 of the first electrode EL1 and the second end EP2' of the second portion P2' of the second electrode EL2 and a distance between the third portion P3' of the second electrode EL2 and the second end EP2 of the second portion P2 of the first electrode EL1 may be equal to or greater than the length of the light emitting element LD.

Figure 9:
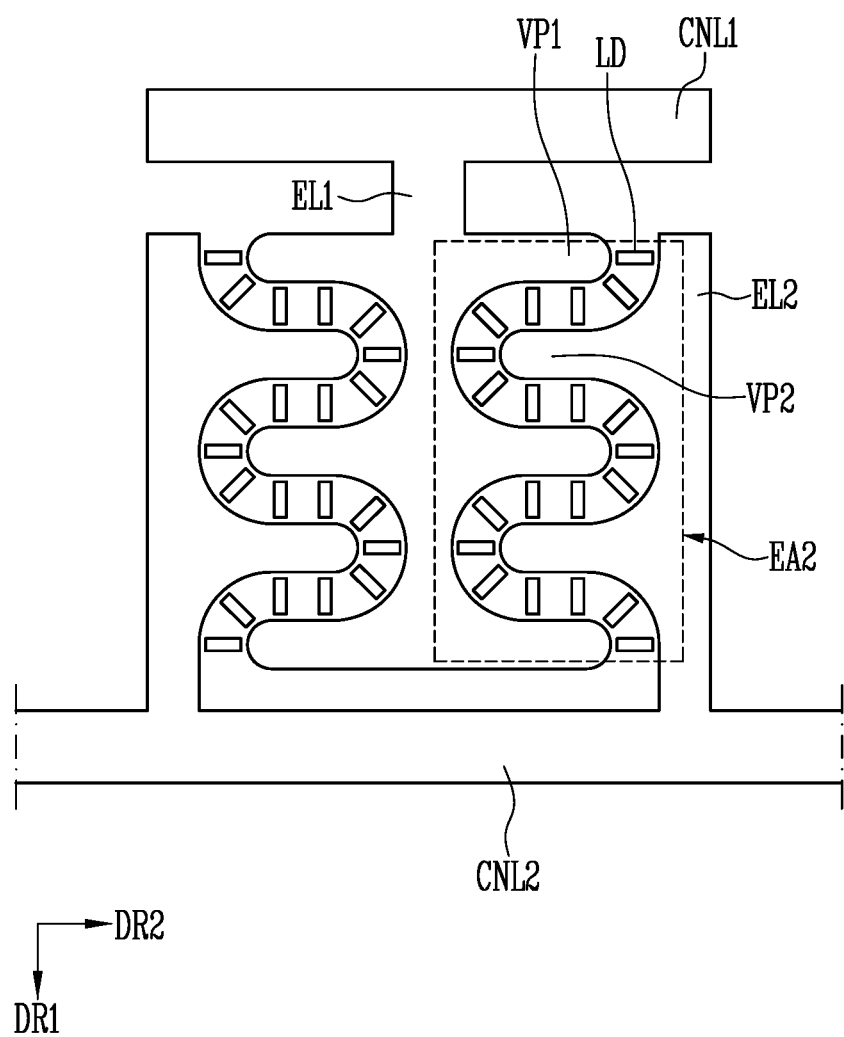
FIG. 9 is a plan view schematically illustrating a display element layer in accordance with an embodiment of the present disclosure.

FIG. 9 is a plan view schematically illustrating a display element layer in accordance with an embodiment of the present disclosure. For example, FIG. 9 schematically shows first and second electrodes EL1 and EL2, and light emitting elements LD included in the display element layer in accordance with an embodiment of the present disclosure. For convenience of description, first and second banks and first and second contact electrodes included in the display element layer are not separately shown in FIG. 9.

Figure 10:
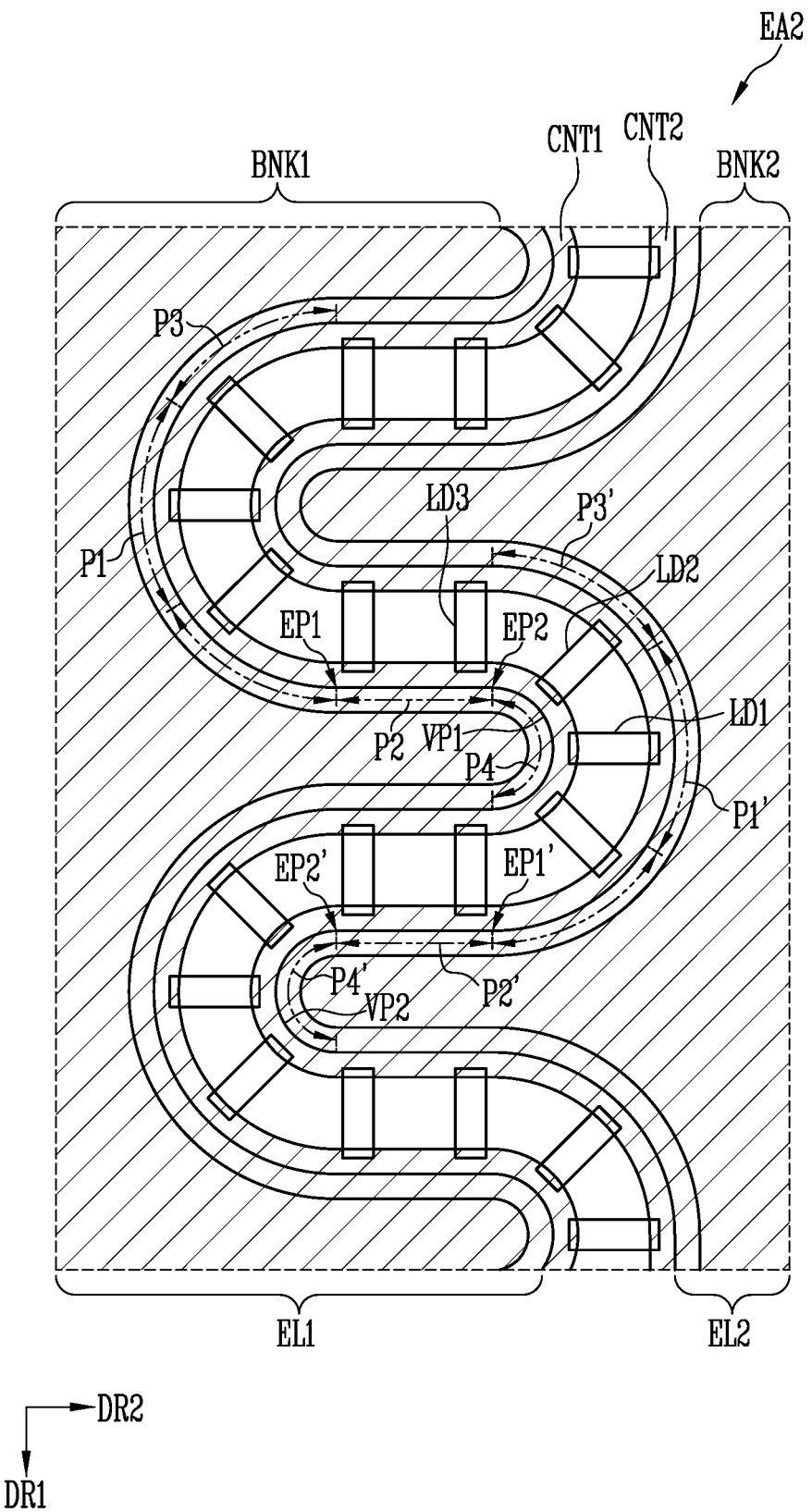
FIG. 10 is a plan view illustrating an embodiment of a display element layer in which portion EA2 of FIG. 9 is enlarged.
Figure 11:
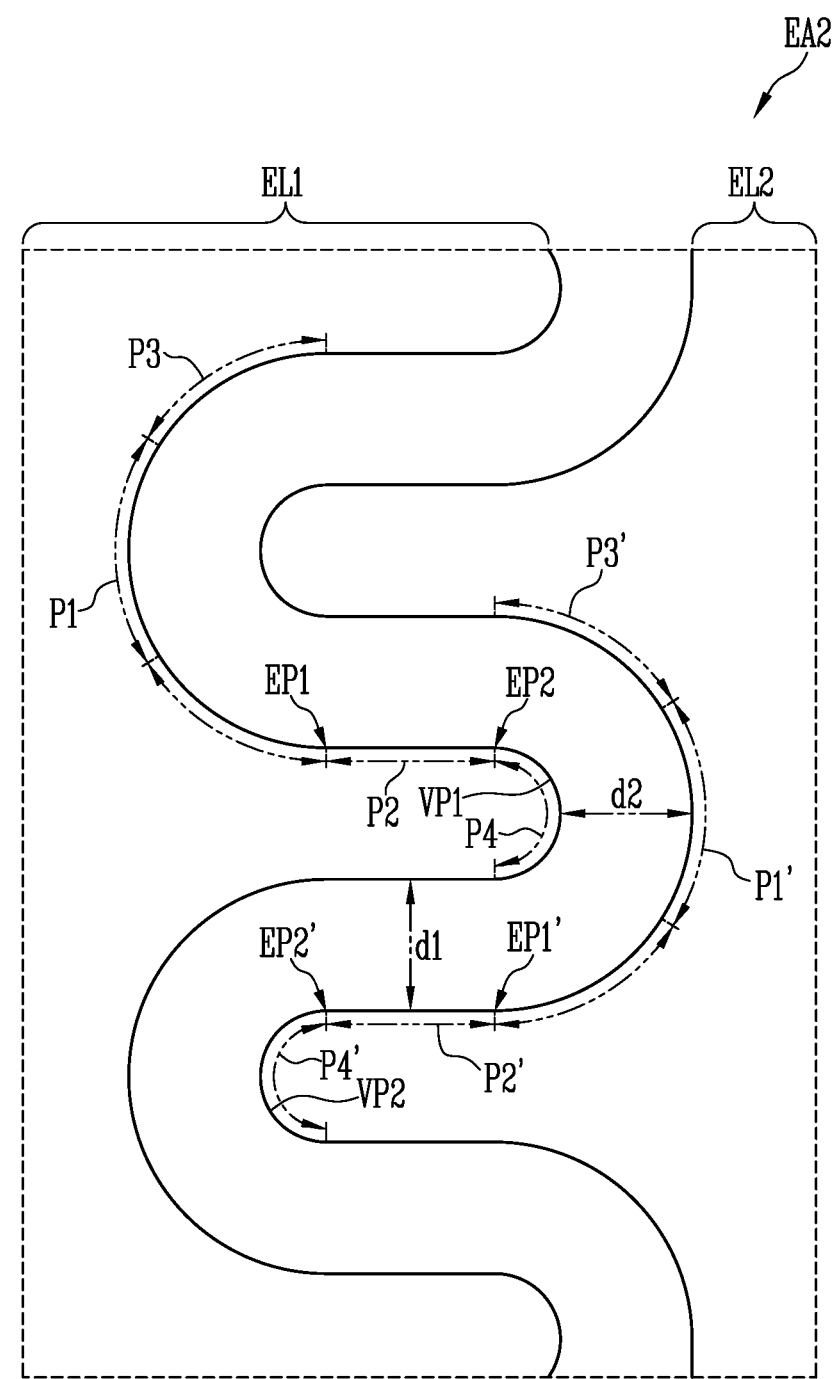
FIG. 11 is a plan view illustrating an embodiment of first and second electrodes shown in FIG. 10.

FIG. 10 is a plan view illustrating an embodiment of a display element layer in which portion EA2 of FIG. 9 is enlarged, and FIG. 11 is a plan view illustrating an embodiment of first and second electrodes shown in FIG. 10.

Referring to FIGS. 7A, 7B, and 9 to 11, the display element layer DPL in accordance with an embodiment of the present disclosure may include first and second banks BNK1 and BNK2 provided on the substrate SUB, first and second electrodes EL1 and EL2, an insulating layer INS, light emitting elements LD, and first and second contact electrodes CNT1 and CNT2.

In an embodiment of the present disclosure, in the plane, the first portion P1 of the first electrode EL1 may be concavely curved in a direction opposite to the first protrusion VP1. The first portion P1 and the third portion P3 of the first electrode EU may have the same (e.g., substantially the same) radius of curvature. As illustrated in FIGS. 10 and 11, the first portion P1 and the third portion P3 of the first electrode EL1 may be provided in a continuous form while having the same (e.g., substantially the same) radius of curvature.

In the plane, the first portion P1' of the second electrode EL2 may be concavely curved in a direction opposite to the second protrusion VP2. Here, the first portion P1' and the third portion P3' of the second electrode EL2 may have the same (e.g., substantially the same) radius of curvature. As illustrated in FIGS. 10 and 11, the first portion P1' and the third portion P3' of the second electrode EL2 may be provided in a continuous form while having the same (e.g., substantially the same) radius of curvature.

In each of the first and second electrodes EU and EL2, the first portion P1 or P1' and the third portion P3 or P3' have the same (e.g., substantially the same) radius of curvature, thus allowing the light emitting elements LD to be effectively aligned between the first and second electrodes EL1 and EL2.

In an embodiment of the present disclosure, the fourth portion P4 of the first electrode EL1 may be convexly curved toward the third portion P3' of the second electrode EL2, and the fourth portion P4' of the second electrode EL2 may be convexly curved toward the third portion P3 of the first electrode EL1.

A distance between the first electrode EL1 and the second electrode EL2 that are adjacent to each other in the plane may be formed to be constant (e.g., substantially constant). Referring to FIG. 11, a distance d2 between the fourth portion P4 of the first electrode EL1 and the first portion P1' of the second electrode EL2 may be equal to a distance d1 between the second portion P2 of the first electrode EL1 and the second portion P2' of the second electrode EL2. Furthermore, a distance between the fourth portion P4 of the first electrode EL1 and the third portion P3' of the second electrode EL2 may be equal to a distance between the second portion P2 of the first electrode EL1 and the second portion P2' of the second electrode EL2.

The distance between the first electrode EL1 and the second electrode EL2 that are adjacent to each other in the plane is formed to be constant (e.g., substantially constant), thus allowing the light emitting elements LD to be effectively aligned between the first and second electrodes EU and EL2 and allowing the aligned light emitting elements LD to more easily come into contact with the first and second contact electrodes CNT1 and CNT2. Thereby, the number of the light emitting elements LD provided per unit area is increased and the number of the light emitting elements LD darkened due to defective contact is reduced, so that the light emitting efficiency of the display device can be improved.

The light emitting elements LD may include the first, second, and third light emitting elements LD1, LD2, and LD3. As illustrated in FIG. 10, the first light emitting element LD1 may be provided between the first portion P1 of the first electrode EL1 and the fourth portion P4' of the second electrode EL2, or between the first portion P1' of the second electrode EL2 and the fourth portion P4 of the first electrode EL1.

The second light emitting element LD2 may be provided between the fourth portion P4 of the first electrode EL1 and the third portion P3' of the second electrode EL2, or between the fourth portion P4' of the second electrode EL2 and the third portion P3 of the first electrode EL1. Here, the second light emitting element LD2 may be arranged diagonally with respect to the first direction DR1 and the second direction DR2.

The third light emitting element LD3 may be provided between the second portion P2 of the first electrode EL1 and the second portion P2' of the second electrode EL2.

Figure 12:
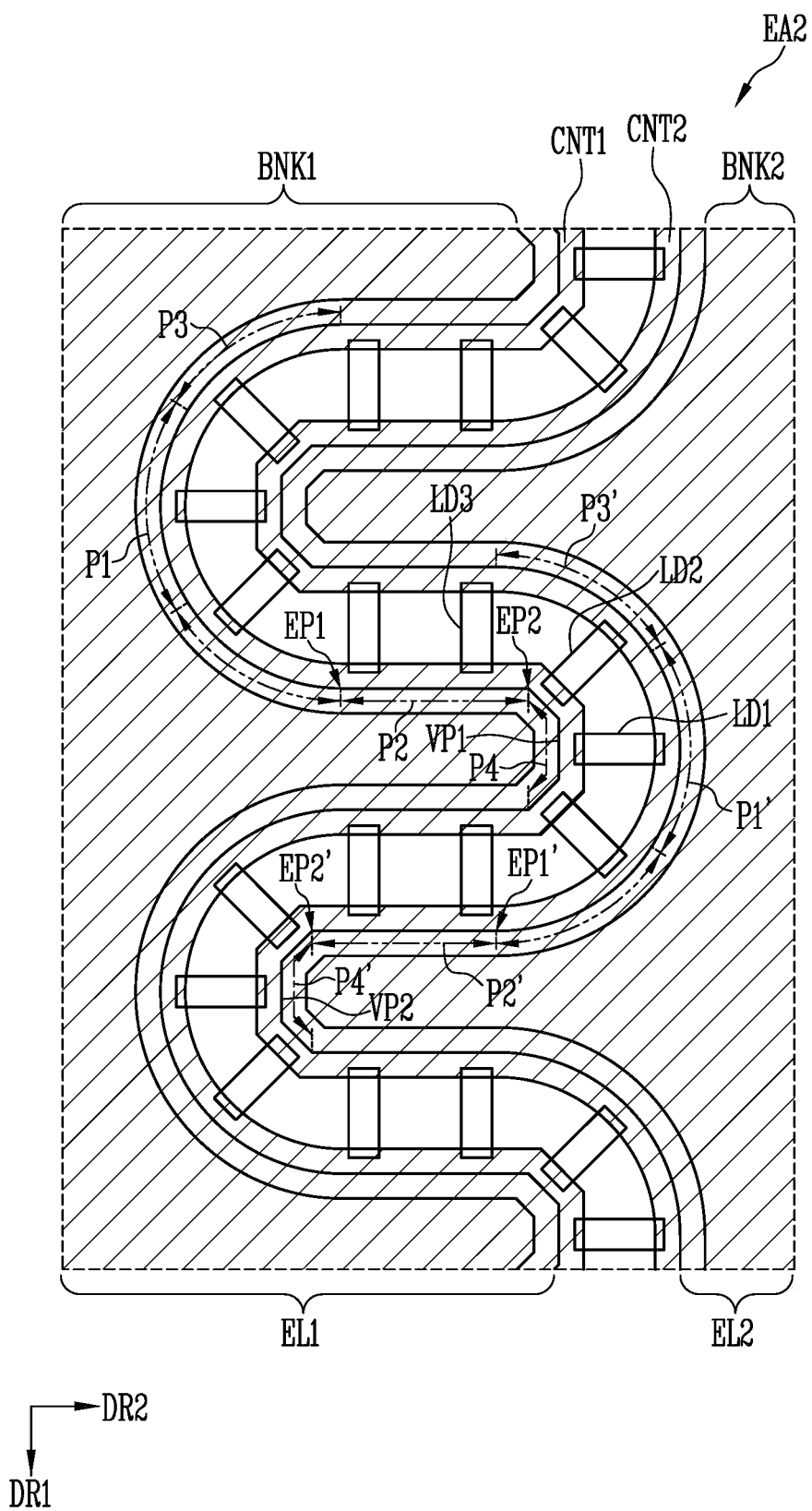
FIG. 12 is a plan view illustrating an embodiment of a display element layer in which portion EA2 of FIG. 9 is enlarged.

FIG. 12 is a plan view illustrating an embodiment of a display element layer in which portion EA2 of FIG. 9 is enlarged.

Referring to FIGS. 7A, 7B, and 12, the display element layer DPL in accordance with an embodiment of the present disclosure may include first and second banks BNK1 and BNK2 provided on the substrate SUB, first and second electrodes EL1 and EL2, an insulating layer INS, light emitting elements LD, and first and second contact electrodes CNT1 and CNT2.

In an embodiment of the present disclosure, the fourth portions P4 and P4' of the first and second electrodes EL1 and EL2 may be provided in a polygonal shape. As illustrated in FIG. 12, the fourth portions P4 and P4' of the first and second electrodes EL1 and EL2 may be provided in a semi-hexagonal shape (e.g., may have a shape of half of a hexagon, or a portion of an octagon), but the present disclosure is not limited thereto. When the alignment signal is applied to the first and second electrodes EL1 and EL2, an electric field may concentrate on protruding portions (e.g. vertices) of the fourth portions P4 and P4' that are provided in the semi-hexagonal shape. Thereby, the light emitting elements LD may be effectively aligned between the first electrode EL1 and the second electrode EL2.

However, the shape of the first and second protrusions VP1 and VP2 is not limited to the above-described shape, and may be variously modified according to the design of the display device.

As illustrated in FIG. 12, the first light emitting element LD1 may be provided between the first portion P1 of the first electrode EL1 and the fourth portion P4' of the second electrode EL2, or between the first portion P1' of the second electrode EL2 and the fourth portion P4 of the first electrode EL1.

The second light emitting element LD2 may be provided between the fourth portion P4 of the first electrode EL1 and the third portion P3' of the second electrode EL2, or between the fourth portion P4' of the second electrode EL2 and the third portion P3 of the first electrode EL1. Here, the second light emitting element LD2 may be arranged diagonally with respect to the first direction DR1 and the second direction DR2.

The third light emitting element LD3 may be provided between the second portion P2 of the first electrode EL1 and the second portion P2' of the second electrode EL2.

Figure 13:
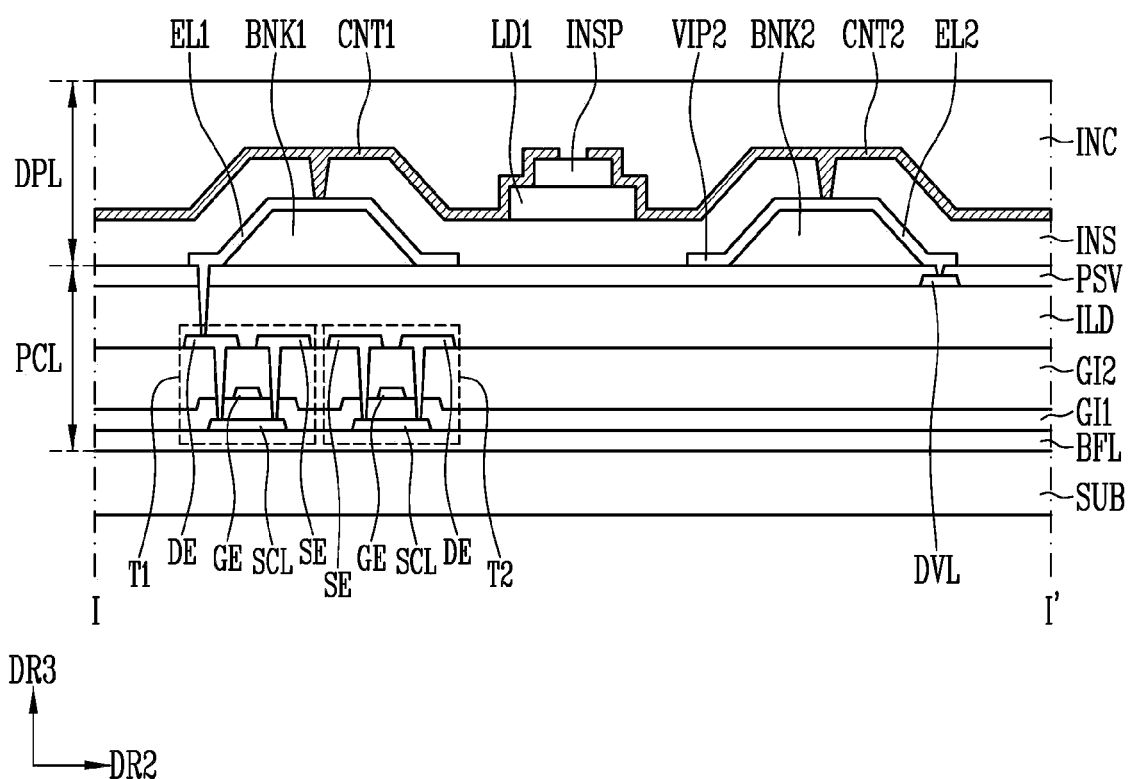
FIG. 13 is a cross-sectional view illustrating a display device in accordance with an embodiment of the present disclosure.

FIG. 13 is a cross-sectional view illustrating a display device in accordance with an embodiment of the present disclosure. For example, FIG. 13 illustrates the cross-sectional view of the display device including the display element layer DPL shown in FIG. 7B.

As illustrated in FIG. 13, the display device may include a substrate SUB, a pixel circuit layer PCL, and a display element layer DPL.

The pixel circuit layer PCL may include a buffer layer BFL, a first transistor T1, a second transistor T2, and a driving voltage line DVL.

The buffer layer BFL may be provided on a surface of the substrate SUB. The buffer layer BFL may prevent or reduce the diffusion of impurities into the first and second transistors T1 and T2. The buffer layer BFL may be provided in a single layer structure or a multilayer structure having at least two or more layers. In the case where the buffer layer BFL has the multilayer structure, the respective layers may be formed of the same material or different materials. The buffer layer BFL may be omitted depending on the material of the substrate SUB and/or processing conditions.

The first transistor T1 may be a driving transistor which is electrically coupled to the light emitting element LD to drive the light emitting element LD. The second transistor T2 may be a switching transistor which is electrically coupled to the first transistor T1 to switch the first transistor T1.

Each of the first and second transistors T1 and T2 may include a semiconductor layer SCL, a gate electrode GE, a source electrode SE, and a drain electrode DE.

The semiconductor layer SCL may be provided on the buffer layer BFL. The semiconductor layer SCL may include a source area and a drain area which respectively come into contact with the corresponding source electrode SE and the corresponding drain electrode DE. An area between the source area and the drain area may be a channel area. The semiconductor layer SCL may be a semiconductor pattern formed of polysilicon, amorphous silicon, an oxide semiconductor, etc. The channel area may be a semiconductor pattern doped with an impurity. The impurity may be an impurity such as an n-type impurity, a p-type impurity or other metals.

The gate electrode GE may be provided on the corresponding semiconductor layer SCL with a first gate insulating layer GI1 interposed therebetween.

The source electrode SE and the drain electrode DE that are included in the first transistor T1 may be respectively coupled to the source area and the drain area of the corresponding semiconductor layer SCL through contact holes passing through the second gate insulating layer GI2 and the first gate insulating layer GI1.

The source electrode SE and the drain electrode DE that are included in the second transistor T2 may be respectively coupled to the source area and the drain area of the corresponding semiconductor layer SCL through contact holes passing through the second gate insulating layer GI2 and the first gate insulating layer GI1.

Although the driving voltage line DVL may be provided on the interlayer insulating layer ILD, the position of the driving voltage line DVL is not limited thereto. The driving voltage line DVL may be electrically coupled to a power supply line to which the second driving power supply (see VSS of FIGS. 2A and 2B) is applied. Thus, the second driving power supply VSS may be supplied to the driving voltage line DVL by the power supply line. However, the present disclosure is not limited thereto. According to an embodiment, a signal corresponding to the driving voltage may be directly supplied from a driver to the driving voltage line DVL.

The pixel circuit layer PCL may further include a passivation layer PSV that covers the first and second transistors T1 and T2. The passivation layer PSV may include an organic insulating layer, an inorganic insulating layer, or the organic insulating layer on the inorganic insulating layer. Here, the inorganic insulating layer may include at least one selected from silicon oxide SiOx, silicon nitride SiNx, silicon oxynitride SiON, and metal oxide such as AlOx. The organic insulating layer may include an organic insulating material that may transmit light. The organic insulating layer may include, for example, at least one selected from poly-acrylates resin, epoxy resin, phenolic resin, polyamides resin, polyimides rein, unsaturated polyesters resin, poly-phenylene ethers resin, poly-phenylene sulfides resin, and benzocyclobutene resin.

Furthermore, there has been illustrated the case where the transistors T1 and T2 are a thin film transistor having a top gate structure, but the present disclosure is not limited to this. According to an embodiment, the transistors T1 and T2 may be a thin film transistor having a bottom gate structure.

FIG. 13 illustrates the first light emitting element LD1 provided between the first and second electrodes EU and EL2. Hereinafter, the first light emitting element LD1 will be mainly described among the light emitting elements LD.

Referring to FIG. 13, the display element layer DPL may include first and second banks BNK1 and BNK2, first and second electrodes EL1 and EL2, an insulating layer INS, a first light emitting element LD1, an insulating pattern INSP, and first and second contact electrodes CNT1 and CNT2.

The first electrode EL1 may be provided on the first bank BNK1, and the second electrode EL2 may be provided on the second bank BNK2. Here, the planar shape of the first electrode EU may correspond to the planar shape of the first bank BNK1, and the planar shape of the second electrode EL2 may correspond to the planar shape of the second bank BNK2.

The first electrode EL1 may include first protrusions VP1 that protrude toward the second electrode EL2 in the plane and are spaced apart from each other in the first direction DR1. The second electrode EL2 may include second protrusions VP2 that protrude toward the first electrode EU in the plane and are spaced apart from each other in the first direction DR1.

One of the first and second electrodes EL1 and EL2 may be electrically coupled to at least one of the plurality of transistors included in the pixel circuit layer PCL.

For example, the first electrode EL1 may be electrically coupled to the drain electrode DE of the first transistor T1 via the contact holes passing through the passivation layer PSV and the interlayer insulating layer ILD. The source electrode SE of the first transistor T1 may be electrically coupled to the power supply line to which the first driving power supply (see VDD of FIGS. 2A and 2B) is applied. Thereby, the first electrode EL1 may receive a signal from the first transistor T1.

The second electrode EL2 may be electrically coupled to the driving voltage line DVL through the contact hole formed through the passivation layer PSV. The second driving power supply VSS may be applied to the driving voltage line DVL. Thereby, the second electrode EL2 may receive a signal (e.g. second driving power supply VSS) from the driving voltage line DVL.

The insulating layer INS may be provided on a surface of the passivation layer PSV on which the first and second banks BNK1 and BNK2 and the first and second electrodes EL1 and EL2 are provided. The first light emitting element LD1 may be provided on the insulating layer INS.

The insulating pattern INSP may be provided on a portion of the first light emitting element LD1, thereby fixing the position of the first light emitting element LD1. The first and second ends of the first light emitting element LD1 may be exposed by the insulating pattern INSP.

The first and second contact electrodes CNT1 and CNT2 may be provided on the insulating layer INS, the first end of the first light emitting element LD1 exposed by the insulating pattern INSP may come into contact with the first contact electrode CNT1, and the second end of the first light emitting element LD1 exposed by the insulating pattern INSP may come into contact with the second contact electrode CNT2. Furthermore, through the contact holes formed through the insulating layer INS, the first contact electrode CNT1 and the first electrode EL1 may be coupled to each other, and the second contact electrode CNT2 and the second electrode EL2 may be coupled to each other.

Thus, the first light emitting element LD1 may be subjected to a set or predetermined voltage through the first electrode EU and the second electrode EL2. If an electric field of a set or predetermined voltage is applied to both ends of the first light emitting element LD1, the first light emitting element LD1 emits light while an electron-hole pair is coupled in the active layer 12 of the first light emitting element LD1. For example, the first and second contact electrodes CNT1 and CNT2 may function as driving electrodes for driving the light emitting elements LD.

Furthermore, as the first contact electrode CNT1 is coupled to the first electrode EL1 and the second contact electrode CNT2 is coupled to the second electrode EL2, the line resistance of each of the first and second contact electrodes CNT1 and CNT2 can be reduced, so that the driving failure of the first light emitting element LD1 due to a signal delay can be minimized or reduced.

Light emitted from both ends of the first light emitting element LD1 may be reflected by the first and second electrodes EL1 and EL2 to be guided upwards (e.g. front direction) with respect to the third direction DR3.

The encapsulation layer INC may be provided on the passivation layer PSV having the first and second electrodes EL1 and EL2, the first and second contact electrodes CNT1 and CNT2, and the first light emitting elements LD1. The encapsulation layer INC covers the first and second electrodes EL1 and EL2, the first and second contact electrodes CNT1 and CNT2, and the first light emitting element LD1 to prevent or reduce exposure of the first light emitting element LD1 to the outside, thereby preventing or reducing corrosion of the first and second electrodes EL1 and EL2, the first and second contact electrodes CNT1 and CNT2, and the first light emitting element LD1.

In some embodiments, an overcoat layer may be provided on the encapsulation layer INC. The overcoat layer may be an encapsulating layer provided to prevent or reduce penetration of oxygen, water, or the like into the first light emitting element LD1.

According to an embodiment of the present disclosure, it is possible to provide a display device having light emitting elements having excellent alignment.

According to an embodiment of the present disclosure, the alignment of light emitting elements is uncomplicated or easy and the number of light emitting elements provided per unit area can be increased, by providing a third portion of each of first and second electrodes in a curved shape.

According to an embodiment of the present disclosure, it is possible to effectively form the contact of first and second contact electrodes and a light emitting element, by providing a third portion of each of first and second electrodes in a curved shape.

However, effects of the present disclosure are not limited to the above-described effects, and various suitable modifications are possible without departing from the spirit and scope of the present disclosure.

The foregoing detailed descriptions may illustrate and describe embodiments of the present disclosure. In addition, the foregoing descriptions merely illustrate and describe example embodiments of the present disclosure. As described above, the subject matter of the present disclosure may be used in various different combinations, modifications and environments, and may be changed or modified within the scope of the subject matter disclosed in this specification, the scope equivalent to the above-described description and/or the scope of technology or knowledge of the art. Therefore, the description is not intended to limit the described subject matter to the form disclosed herein. Also, it is intended that the appended claims be construed to include equivalent and alternative embodiments.

What is claimed is:

1. A display device, comprising:
a display element layer on a substrate,
wherein the display element layer comprises:
a first electrode and a second electrode that extend in a first direction and are spaced apart from each other in a second direction different from the first direction;
light emitting elements electrically coupled to the first electrode and the second electrode;
a first contact electrode electrically coupling the first electrode to the light emitting elements; and
a second contact electrode electrically coupling the second electrode to the light emitting elements,
wherein the second electrode comprises a first extension and a second extension facing the first extension, and the first extension of the second electrode, the first electrode, the second extension of the second electrode are sequentially arranged in the second direction,
wherein the first electrode comprises:
an electrode portion extending in the first direction;
first protrusions that protrude in a plane toward the first extension of the second electrode or the second extension of the second electrode, and are spaced apart from each other in the first direction;
a first portion located between the first protrusions;
a second portion corresponding to a side of each of the first protrusions; and
a third portion coupled between the first portion and a first end of the second portion,
wherein the second electrode further comprises:
second protrusions that protrude in the same plane toward the first electrode and are spaced apart from each other in the first direction;
a first portion located between the second protrusions;
a second portion corresponding to a side of each of the second protrusions; and
a third portion coupled between the first portion and a first end of the second portion,
wherein the third portion of each of the first and second electrodes is in the same plane and has a curved shape,
wherein the first protrusions comprise a first sub protrusion protruding from a first side of the electrode portion in the second direction and a second sub protrusion protruding from a second side of the electrode portion in a direction opposite to the second direction,
wherein the first contact electrode overlaps the first electrode, the first contact electrode has a planar shape that is the same as a planar shape of the first electrode, and the planar shape of the first contact electrode is larger than the planar shape of the first electrode, and
wherein the second contact electrode overlaps the second electrode, the second contact electrode has a planar shape that is the same as a planar shape of the second electrode, the planar shape of the second contact electrode is larger than the planar shape of the second electrode.

2. The display device according to claim 1, wherein the third portion of the first electrode is curved in the same plane concavely in a direction away from an adjacent second protrusion selected from among the second protrusions, and
wherein the third portion of the second electrode is curved in the same plane concavely in a direction away from an adjacent first protrusion selected from among the first protrusions.

3. The display device according to claim 2, wherein the first electrode further comprises a fourth portion extending from a second end of the second portion of the first electrode, and
wherein the second electrode further comprises a fourth portion extending from a second end of the second portion of the second electrode.

4. The display device according to claim 3, wherein the fourth portion of the first electrode faces the first portion of the second electrode, and
wherein the fourth portion of the second electrode faces the first portion of the first electrode.

5. The display device according to claim 3, wherein a distance from the second end of the second portion of the first electrode to the third portion of the second electrode is constant, and
wherein a distance from the second end of the second portion of the second electrode to the third portion of the first electrode is constant.

6. The display device according to claim 3, wherein the light emitting elements comprises:
a first light emitting element provided between the first portion of the first electrode and the fourth portion of the second electrode or between the first portion of the second electrode and the fourth portion of the first electrode.

7. The display device according to claim 1, wherein the first protrusions and the second protrusions are alternately arranged along the first direction.

8. The display device according to claim 1, wherein at least a portion of the second portion of the first electrode and at least a portion of the second portion of the second electrode face each other in the first direction.

9. The display device according to claim 1, wherein at least one of the light emitting elements is provided between a second end of the second portion of the first electrode and the third portion of the second electrode or between a second end of the second portion of the second electrode and the third portion of the first electrode.

10. The display device according to claim 9, wherein the at least one of the light emitting elements is arranged diagonally with respect to the first and second directions.

11. The display device according to claim 1, wherein the light emitting elements comprises:

at least one of the light emitting elements between the second portion of the first electrode and the second portion of the second electrode.

12. The display device according to claim 1, wherein the third portion of the first electrode is curved in the same plane to be convex toward an adjacent second protrusion selected from among the second protrusions, and wherein the third portion of the second electrode is curved in the same plane to be convex toward an adjacent first protrusion selected from among the first protrusions.

13. The display device according to claim 1, wherein the first portion of the first electrode is curved in the same plane concavely in a direction away from an adjacent second protrusion selected from among the second protrusions, and wherein the first portion of the second electrode is curved in the same plane concavely in a direction away from an adjacent first protrusion selected from among the first protrusions.

14. The display device according to claim 13, wherein the first portion and the third portion in each of the first and second electrodes have the same radius of curvature.

15. The display device according to claim 14, wherein the first electrode further comprises a fourth portion extending from a second end of the second portion of the first electrode, and wherein the second electrode further comprises a fourth portion extending from a second end of the second portion of the second electrode.

16. The display device according to claim 15, wherein the fourth portion of the first electrode is curved in the same plane to be convex toward the third portion of the second electrode, and wherein the fourth portion of the second electrode is curved in same the plane to be convex toward the third portion of the first electrode.

17. The display device according to claim 16, wherein a distance between the first and second electrodes that are adjacent to each other in the plane is constant.

18. The display device according to claim 15, wherein the fourth portion of each of the first and second electrodes has a polygonal shape.

* * * * *